(12) United States Patent
Ohnuma et al.

(10) Patent No.: US 7,588,970 B2
(45) Date of Patent: Sep. 15, 2009

(54) SEMICONDUCTOR DEVICE AND MANUFACTURING METHOD THEREOF

(75) Inventors: Hideto Ohnuma, Kanagawa (JP); Shigeharu Monoe, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 311 days.

(21) Appl. No.: 11/421,922

(22) Filed: Jun. 2, 2006

(65) Prior Publication Data

US 2006/0278875 A1     Dec. 14, 2006

(30) Foreign Application Priority Data

Jun. 10, 2005    (JP)   ............... 2005-171565

(51) Int. Cl.
*H01L 21/00* (2006.01)
*H01L 21/84* (2006.01)

(52) U.S. Cl. .......................... 438/149; 257/72

(58) Field of Classification Search .......... 257/59, 257/72; 438/149
See application file for complete search history.

(56) References Cited

U.S. PATENT DOCUMENTS

| | | | |
|---|---|---|---|
| 4,818,715 | A | 4/1989 | Chao |
| 5,371,025 | A | 12/1994 | Sung |
| 5,744,381 | A | 4/1998 | Tabata et al. |
| 5,763,301 | A | 6/1998 | Rha et al. |
| 5,818,067 | A | 10/1998 | Rha et al. |
| 6,066,534 | A | 5/2000 | Son |
| 6,071,652 | A | 6/2000 | Feldman et al. |
| 6,365,917 | B1 | 4/2002 | Yamazaki |
| 6,420,073 | B1 | 7/2002 | Suleski et al. |
| 6,515,336 | B1 | 2/2003 | Suzawa et al. |

(Continued)

FOREIGN PATENT DOCUMENTS

CN     1471136     1/2004

(Continued)

OTHER PUBLICATIONS

C.W. Kim et al.; "A Novel Four-Mask-Count Process Architecture for TFT-LCDS"; *SID '00 Digest*; pp. 1006-1009; 2000.

(Continued)

*Primary Examiner*—Jerome Jackson, Jr.
*Assistant Examiner*—Anthony Ho
(74) *Attorney, Agent, or Firm*—Fish & Richardson P.C.

(57) ABSTRACT

The present invention provides a TFT including at least one LDD region in a self-alignment manner without forming a sidewall spacer and increasing the number of manufacturing steps. A photomask or a reticle provided with an assist pattern that is formed of a diffraction grating pattern or a semi-transmitting film and has a function of reducing light intensity is employed in a photolithography step of forming a gate electrode, an asymmetrical resist pattern having a region with a thick thickness and a region with a thickness thinner than that of the above region on one side is formed, a gate electrode having a stepped portion is formed, and an LDD region is formed in a self-alignment manner by injecting an impurity element to the semiconductor layer through the region with a thin thickness of the gate electrode.

21 Claims, 11 Drawing Sheets

U.S. PATENT DOCUMENTS

| | | |
|---|---|---|
| 6,534,425 B1 | 3/2003 | Karr et al. |
| 6,534,826 B2 | 3/2003 | Yamazaki |
| 6,541,294 B1 | 4/2003 | Yamazaki et al. |
| 6,613,620 B2 | 9/2003 | Fujimoto et al. |
| 6,638,667 B2 | 10/2003 | Suleski et al. |
| 6,646,287 B1 | 11/2003 | Ono et al. |
| 6,660,462 B1 | 12/2003 | Fukuda |
| 6,661,096 B1 | 12/2003 | Takayama et al. |
| 6,664,145 B1 | 12/2003 | Yamazaki et al. |
| 6,707,068 B2 | 3/2004 | Fujimoto et al. |
| 6,773,996 B2 | 8/2004 | Suzawa et al. |
| 6,828,586 B2 | 12/2004 | Fujimoto et al. |
| 6,872,604 B2 | 3/2005 | Yamazaki et al. |
| 6,909,114 B1 | 6/2005 | Yamazaki |
| 6,936,847 B2 | 8/2005 | Tanabe et al. |
| 7,115,447 B2 | 10/2006 | Monoe |
| 7,169,656 B2 | 1/2007 | Ohnuma et al. |
| 7,223,643 B2 | 5/2007 | Ohnuma et al. |
| 7,226,822 B2 | 6/2007 | Takayama et al. |
| 7,235,810 B1 | 6/2007 | Yamazaki et al. |
| 7,245,018 B1 | 7/2007 | Takayama et al. |
| 7,316,946 B2 | 1/2008 | Ohnuma et al. |
| 7,402,525 B2 | 7/2008 | Monoe |
| 2001/0019127 A1 | 9/2001 | Ishida |
| 2002/0025591 A1 | 2/2002 | Ohnuma et al. |
| 2002/0146627 A1 | 10/2002 | Suleski et al. |
| 2004/0195590 A1 | 10/2004 | Suzawa et al. |
| 2006/0014335 A1 | 1/2006 | Ohnuma et al. |
| 2007/0224791 A1 | 9/2007 | Takayama et al. |
| 2007/0281401 A1 | 12/2007 | Yamazaki et al. |
| 2008/0014666 A1 | 1/2008 | Takayama et al. |
| 2008/0119024 A1 | 5/2008 | Ohnuma et al. |

FOREIGN PATENT DOCUMENTS

| | | |
|---|---|---|
| EP | 1 003 223 A2 | 5/2000 |
| JP | 07-142734 | 6/1995 |
| JP | 10-032327 | 2/1998 |
| JP | 10-098189 | 4/1998 |
| JP | 2000-228527 | 8/2000 |
| JP | 2001-094113 | 4/2001 |
| JP | 2002-151523 | 5/2002 |

OTHER PUBLICATIONS

Chinese Patent Office Action (Chinese Patent Application No. 200610091544.9) dated Apr. 3, 2009, with translation; 24 pages.

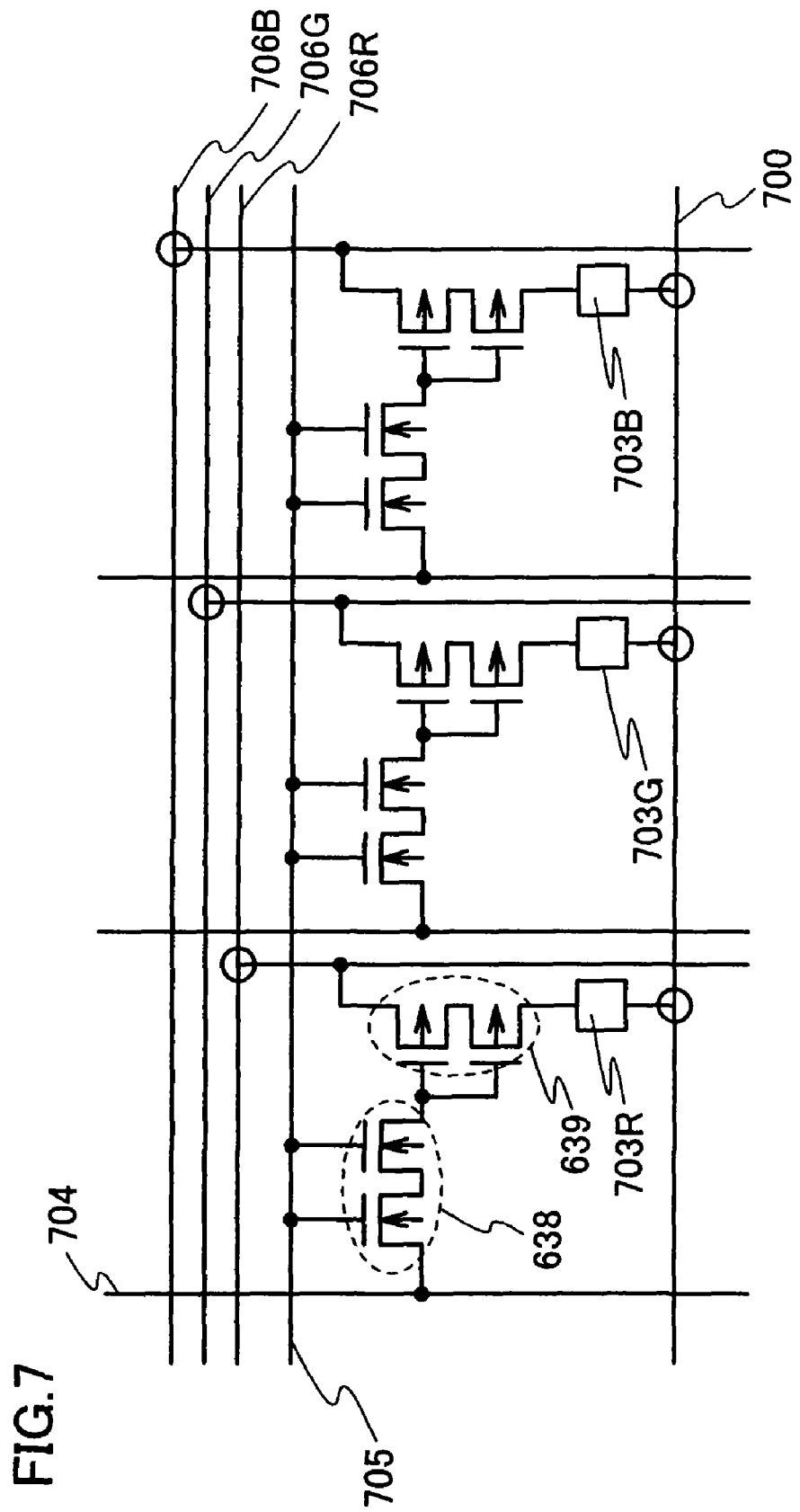

SEMICONDUCTOR DEVICE AND MANUFACTURING METHOD THEREOF

BACKGROUND OF THE INVENTION

1. Field of the Invention

The present invention relates to a semiconductor device including a circuit formed by using a thin film transistor (hereinafter also referred to as a TFT) and a manufacturing method thereof. For example, the present invention relates to an electronic device provided with, as a component, an electrooptic device typified by a liquid crystal display panel or a light-emitting display device having an organic light-emitting element.

In this specification, a semiconductor device generally refers to a device which can function by utilizing semiconductor characteristics, and an electrooptic device, a semiconductor circuit, and an electronic device are all semiconductor devices.

2. Description of the Related Art

In recent years, a technique for forming a thin film transistor (TFT) using a semiconductor thin film (several nm to several hundred nm) formed over a substrate having an insulating surface has attracted attention. A thin film transistor is broadly applied to electronic devices such as an IC and an electrooptic device, and particularly, a thin film transistor as a switching element of an image display device is expected to be developed quickly.

In particular, an active matrix display device (a liquid crystal display device or a light-emitting display device) provided with a switching element formed of a TFT for each of display pixels arranged in matrix has been actively developed.

In an active matrix display device, development of expanding an effective image region in a pixel portion has been advanced. In order to enlarge an area of an effective image region, it is necessary to make an area of a TFT arranged in a pixel portion (a pixel TFT) as small as possible. In addition, in order to reduce a manufacturing cost, development of forming a driver circuit and a pixel portion over the same substrate has been also advanced. In particular, a TFT using a polysilicon film can be operated at high speed because field effect mobility is higher that that of a TFT using an amorphous silicon film.

In a module mounted in a display device, a pixel portion for performing image display for each function block and a driver circuit for controlling the pixel portion such as a shift register circuit, a level shifter circuit, a buffer circuit, or a sampling circuit, which is based on a CMOS circuit, are formed over one substrate.

In a case where a driver circuit and a pixel portion are formed over the same substrate, there is a tendency that an area of a region except for a pixel region, which is referred to as a frame portion, is increased, as compared with a thin film transistor in which a driver circuit is mounted by a TAB method. In order to reduce an area of a frame portion, it is necessary to make scale of a circuit forming a driver circuit smaller.

In particular, in a light-emitting display device provided with organic light-emitting elements (EL elements) arranged in matrix, a plurality of TFTs having different functions is necessary in one pixel. Further, also in a liquid crystal display device, it is attempted to form a switching TFT and a memory element such as an SRAM in one pixel. In addition, even in the case where a pixel portion and a driver circuit are formed over the same substrate, it is expected to downsize as much as possible.

In Patent Document 1 (Japanese Patent Application Laid-Open No: H10-98189), a field effect transistor having a gate electrode in which one side portion is thin is disclosed. The field effect transistor of Patent Document 1 has a structure in which a cross-sectional shape of the gate electrode is an L-shape, a sidewall spacer is formed along a back side of the L-shape, and a low-concentration drain (LDD: Lightly Doped Drain) is formed only on a drain side by injecting an ion in a high-concentration by using the gate electrode provided with the sidewall spacer as a mask. In addition, a silicide layer is formed over the surface of the L-shape of the gate electrode.

Further, in Patent Document 2 (Japanese Patent Application Laid-Open No: H7-142734), a thin film transistor having an LDD region on one side is disclosed. The thin film transistor of Patent Document 2 is provided with a sidewall spacer only on one side of the gate electrode. It is described in Patent Document 2 that a high-concentration drain region below the sidewall spacer that is formed in ion injection by using the sidewall spacer as a mask has an inclined connection structure, and the inclined connection structure has similar effect to the LDD structure.

Further, in Patent Document 3 (Japanese Patent Application Laid-Open No: H10-32327), a method for manufacturing a semiconductor device is disclosed, in which sidewalls having different widths are formed on a source side and a drain side, and an ion is injected to form a high-concentration impurity diffusion layer.

Further, a process for manufacturing a TFT is disclosed in Patent Document 4 (Japanese Patent Application Laid-Open No: 2002-151523) by the present applicants, in which a photomask or a reticle provided with an assist pattern that is formed of a diffraction grating pattern or a semi-transmitting film and has a function of reducing light intensity is employed in a photolithography step of forming a gate electrode.

Further, a thin film transistor having two gate electrode layers and an LDD region on one side is disclosed by the present applicants in Patent Document 5 (Japanese Patent Application Laid-Open No: 2000-228527).

SUMMARY OF THE INVENTION

Each of the techniques disclosed in Patent Documents 1, 2, and 3 requires a step of forming a sidewall spacer (also referred to as a sidewall).

The present invention provides a TFT including at least one LDD region in a self-alignment manner without forming a sidewall spacer and increasing the number of manufacturing steps.

Further, the present invention provides a method for manufacturing various TFTs such as a TFT having an LDD region on one side of a channel formation region and a TFT having LDD regions on both sides of a channel formation region over the same substrate without increasing the number of manufacturing steps.

Further, a width of a sidewall spacer (a length in a channel length direction) depends on a thickness of an insulating film before etch-back, and for example, it is difficult to form the width to be 0.5 μm or more. Therefore, according to the techniques disclosed in Patent Documents 1, 2, and 3, it is also difficult to form an LDD region having a width of 0.5 μm or more in a self-alignment manner. It is also an object of the present invention to achieve formation of an LDD region having a width of 0.5 μm or more in a self-alignment manner.

It is another object of the present invention to form a plurality of elements in a limited area and integrate the elements by reducing an area of the elements so as to miniaturize a display pixel pitch and integrate a driver circuit for driving a pixel portion in accordance with much higher definition (increase of the number of pixels) and downsizing in the future in an electrooptic device typified by a liquid crystal display device, a light-emitting device having an EL element, and a semiconductor device. Further, it is also an object to improve quality of an electronic device provided with an electrooptic device or a light-emitting device by improving image quality of an electrooptic device or a light-emitting device, or by integrating various circuits to attempt downsizing.

Further, it is an object of the present invention to provide a semiconductor device provided with a circuit having high operational performance and reliability. It is another object to improve reliability of a semiconductor device so that reliability of an electronic device provided with the semiconductor device is improved.

According to one feature of the present invention, a method for manufacturing a semiconductor device includes the steps of forming an asymmetrical resist pattern having a region with a thick thickness and a region with a thickness thinner than that of the above region on one side (a cross-sectional shape of the resist pattern is asymmetrical in a width or a length direction of a gate electrode) by employing a photomask or a reticle provided with an assist pattern that is formed of a diffraction grating pattern or a semi-transmitting film and has a function of reducing light intensity to a photolithography step of forming a gate electrode, forming a gate electrode having a stepped portion, and forming an LDD region in a self-alignment manner by injecting an impurity element into a semiconductor layer through the region with a thin thickness of the gate electrode. A TFT structure of the present invention includes one region, to which an impurity element is added in a low-concentration, between a channel formation region and a drain region formed by adding an impurity element in a high-concentration, and the above one region is referred to as an LDD region.

In addition, an obtained structure is also one feature of the present invention, and according to another feature of the present invention, a semiconductor device includes a gate electrode having a stepped portion, that is, a gate electrode having a region with a thick thickness and a region with a thickness thinner than that of the above region on one side, and an LDD region overlapped with the region with a thin thickness of the gate electrode with an insulating layer interposed therebetween. By the structure having the LDD region overlapped with the region with a thin thickness of the gate electrode with the insulating layer interposed therebetween, electric field intensity in the vicinity of a drain is relieved, hot-carrier injection is prevented, and a deterioration phenomenon is effectively prevented.

An LDD region overlapped with the gate electrode is referred to as a Lov region. In Patent Document 4, a structure is disclosed, in which a symmetrical resist pattern is formed and Lov regions are formed on both sides of a channel formation region. On the other hand, in the present invention, a structure is disclosed, in which an asymmetrical resist pattern is formed and a Lov region is formed on one side of a channel formation region.

According to a structure of the present invention disclosed in this specification, a semiconductor device includes a semiconductor layer over a substrate having an insulating surface, a gate insulating layer over the semiconductor layer, and a gate electrode formed of stacked conductive layers over the gate insulating layer, where the semiconductor layer includes a channel formation region, two of first impurity regions on both sides of the channel formation region, and one second impurity region between one of the first impurity regions and the channel formation region; a first conductive layer forming one layer of the stacked gate electrode is overlapped with at least the channel formation region and the second impurity region; and a second conductive layer forming another layer of the stacked gate electrode is provided over and in contact with the first conductive layer and overlapped with the channel formation region.

In the above structure, the first conductive layer and the second conductive layer are formed by different materials. By forming the first conductive layer and the second conductive layer by different materials, a difference is generated in an etching rate, and the above structure can be more easily formed.

In addition, in the above structure, a thickness of the first conductive layer is thinner than that of the second conductive layer. By making the first conductive layer thinner, the second impurity region can be more easily formed when an impurity element is added to the semiconductor layer through the first conductive layer.

In addition, the width of the second conductive layer is the same as the width of the channel formation region. When the width of the second conductive layer is the same as the width of the channel formation region, the first impurity region and the second impurity region are formed in a self-alignment manner.

In addition, TFTs having different structures can be formed over the same substrate at the same time. According to another structure of the present invention, a semiconductor device, in which a first thin film transistor having a first semiconductor layer and a second thin film transistor having a second semiconductor layer are provided over the same substrate, includes the first semiconductor layer and the second semiconductor layer over a substrate having an insulating surface, a gate insulating layer over the first semiconductor layer and the second semiconductor layer, and a first gate electrode and a second gate electrode formed by stacked conductive layers over the gate insulating layer, where the first semiconductor layer includes a first channel formation region, two of first impurity regions on both sides of the first channel formation region, and one second impurity region between one of the first impurity regions and the first channel formation region; the first channel formation region is overlapped with the first gate electrode with the gate insulating layer interposed therebetween; a first conductive layer forming one layer of the stacked first gate electrode is overlapped with at least the first channel formation region and the second impurity region; a second conductive layer forming another layer of the stacked first gate electrode is provided over and in contact with the first conductive layer and overlapped with the first channel formation region; the second semiconductor layer includes a second channel formation region, two of first impurity regions on both sides of the second channel formation region, and second impurity regions each between the first impurity region and the second channel formation region; the second channel formation region is overlapped with the second gate electrode with the gate insulating layer interposed therebetween; a first conductive layer forming one layer of the stacked second gate electrode is overlapped with at least the second channel formation region and two of the second impurity regions; and a second conductive layer forming another layer of the stacked second gate electrode is provided over and in contact with the first conductive layer and overlapped with the second channel formation region.

In accordance with the above structure, a TFT having two LDD regions on both sides of a channel formation region and a TFT having an LDD region on one side of a channel formation region can be formed over the same substrate, and each TFT can be used for a suitable circuit. A transistor having an LDD region on one side may be applied to a transistor to which only positive voltage or negative voltage is applied between source and drain electrodes, specifically, a transistor forming a logic gate such as an inverter circuit, a NAND circuit, a NOR circuit, or a latch circuit, or a transistor forming an analog circuit such as a sense amplifier, a constant voltage generating circuit, or a VCO.

In addition, a manufacturing method for achieving the above structure is also one of the invention. According to another structure of the present invention, a method for manufacturing a semiconductor device includes the steps of forming an insulating film over a semiconductor layer, forming a conductive film over the insulating film, forming a resist pattern having a region with a thick thickness and a region with a thickness thinner than that of the above region on one side over the conductive film by using a photomask or a reticle having a diffraction grating pattern or a semi-transmitting portion, forming a gate electrode having a region with a thick thickness and a region with a thickness thinner than that of the above region on one side by selectively etching the conductive film, forming first impurity regions arranged on both sides of a channel formation region overlapped with the gate electrode in the semiconductor layer by injecting an impurity element to the semiconductor layer using the region with a thick thickness and the region with a thin thickness of the gate electrode as a mask, and forming a second impurity region in a region overlapped with the gate electrode with a thin thickness in the semiconductor layer by injecting an impurity element to the semiconductor layer through the region with a thin thickness of the gate electrode. It is to be noted that, by using the photomask or the reticle having a diffraction grating pattern or a semi-transmitting portion, a cross-sectional shape of the resist pattern is substantially asymmetry in a width or a length direction of the gate electrode. In this specification, a cross-sectional shape refers to a shape taken along a plane perpendicular to the substrate plane.

In addition, in order to shorten the manufacturing steps, only one doping may be performed. According to another structure of the present invention, a method for manufacturing a semiconductor device includes the steps of forming an insulating film over a semiconductor layer, forming a conductive film over the insulating film, forming a resist pattern having a region with a thick thickness and a region with a thickness thinner than that of the above region on one side over the conductive film by using a photomask or a reticle having a diffraction grating pattern or a semi-transmitting portion, forming a gate electrode having a region with a thick thickness and a region with a thickness thinner than that of the above region on one side by selectively etching the conductive film, and forming first impurity regions on both sides of a channel formation region overlapped with the gate electrode in the semiconductor layer and a second impurity region in a region overlapped with the gate electrode with a thin thickness in the semiconductor layer by injecting an impurity element to the semiconductor layer.

In addition, in each of the manufacturing methods, the region overlapped with the gate electrode with a thick thickness in the semiconductor layer is a channel formation region, and the channel formation region is arranged between the first impurity region and the second impurity region to be in contact. By such a structure, high speed driving can be achieved as compared with a TFT having LDD regions on both sides of a channel formation region, and an area can also be reduced.

In addition, in each of the manufacturing methods, the conductive layer is a stacked layer of different conductive materials. When a stacked layer of different conductive materials is employed, a gate electrode having a region with a thick thickness and a region with a thickness thinner than that of the above region on one side can be easily formed by utilizing a difference in an etching rate.

By the present invention, an LDD region having a width (a length in a channel length direction) of 0.5 µm or more, preferably 1 to 1.5 µm, further 2 µm or more, can be provided in a self-alignment manner at least on one side without increasing the number of manufacturing steps. As the width of the LDD region gets longer, electric field intensity in the vicinity of a drain can be relieved, hot-carrier injection can be prevented, and a deterioration phenomenon can be effectively prevented.

In addition, the LDD region is overlapped with the region with a thin thickness of the gate electrode. As compared with a TFT having LDD regions overlapped with the region with a thin thickness of the gate electrode on both sides, a TFT of the present invention having an LDD region overlapped with the region with a thin thickness of the gate electrode on one side has low parasitic capacitance because an overlapped portion is smaller, and further, the area can be reduced.

In addition, in the present invention, by using a photomask or a reticle provided with an assist pattern that is formed of a diffraction grating pattern or a semi-transmitting film and has a function of reducing light intensity, the width of the region with a thin thickness of the gate electrode can be freely set, and thus, the width of the LDD region which can be formed in a self-alignment manner using the gate electrode as a mask can be freely set. By using a photomask or a reticle having a diffraction grating pattern or a semi-transmitting portion, a resist pattern can be formed to have an asymmetrical shape in a width or a length direction of the gate electrode without increasing manufacturing steps, and the asymmetrical shape can be precisely controlled by light exposure conditions. In addition, by using a photomask or a reticle selectively provided with an assist pattern, a first resist pattern having a substantially symmetrical shape in a width or a length direction of the gate electrode and a second resist pattern having an asymmetrical shape in a width or a length direction of the gate electrode can be formed over the same plane by the same light exposure conditions. When a gate electrode is formed by using the first resist pattern, a first gate electrode having a symmetrical cross-sectional shape in a channel length direction can be formed. Further, when a gate electrode is formed by using the second resist pattern, a second gate electrode having an asymmetrical cross-sectional shape in a channel length direction can be formed.

Depending on doping conditions, an impurity element is conducted below a gate electrode with a thick thickness to be injected to the semiconductor layer, and there is also a case where an impurity region that is overlapped with the gate electrode with a thick thickness and has a concentration gradient (also referred to as a low-concentration impurity region) is generated to be approximately 0.1 µm. Therefore, it is also possible to provide a TFT structure which has an impurity region (approximately 0.1 µm) that is overlapped with the gate electrode with a thick thickness on one side of a channel formation region and has a concentration gradient, and an LDD region (0.5 µm or more) overlapped with the gate electrode with a thin thickness on the other side of the channel formation region.

In the present invention, a TFT including an LDD region only on one side of a channel formation region in a self-alignment manner can be provided without forming a sidewall spacer and increasing the number of manufacturing steps. By using a TFT including an LDD region only on one side of a channel formation region, a plurality of elements can be formed in a limited area, and an area of the elements and a circuit can be reduced and integrated.

Further, by using a TFT including an LDD region only on one side of a channel formation region, parasitic capacitance or parasitic resistance can be reduced.

In addition, a width of an LDD region formed only on one side of a channel formation region can be 0.5 μm or more, preferably 1.5 to 2 μm, further 2 μm or more. Therefore, in accordance with the present invention, a semiconductor device provided with a circuit having high operational performance and reliability can be achieved.

BRIEF DESCRIPTION OF THE DRAWINGS

In the accompanying drawings:

FIG. 7 is a diagram showing an equivalent circuit in a pixel portion (Embodiment Mode 5)

DESCRIPTION OF THE INVENTION

Figure 1A:
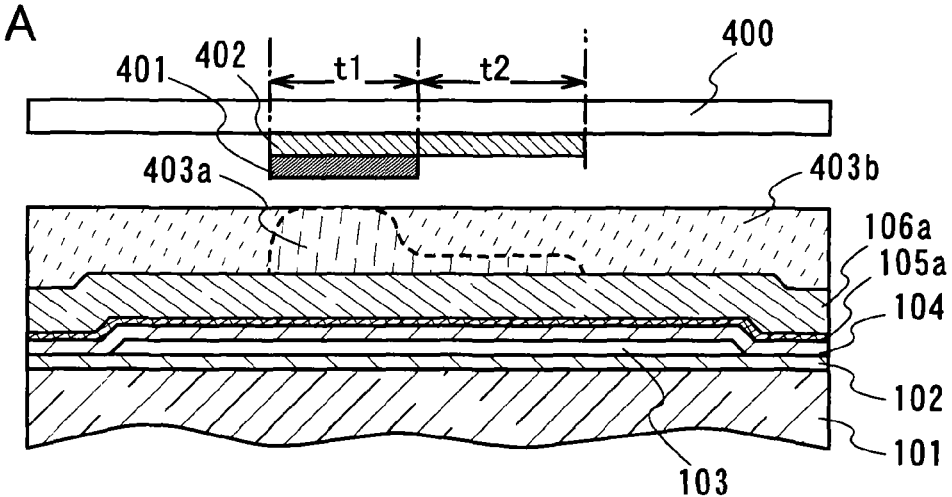
FIGS. 1A to 1D are cross-sectional views each showing a manufacturing step of a semiconductor device (Embodiment Mode 1)

Hereinafter, embodiment modes of the present invention will be explained in detail with reference to the accompanying drawings. It is to be noted that the present invention is not limited to the following embodiment modes, and various changes are permitted unless it departs from the purpose of the invention.

EMBODIMENT MODE 1

This embodiment mode shows a step of forming a low-concentration impurity region in a self-alignment manner only on one side of a channel formation region by using a gate electrode of a TFT as a mask in ion-doping.

First, a first insulating film (a base insulating film) 102 is formed over a substrate 101 having an insulating surface. The substrate 101 having an insulating surface can be a light-transmitting substrate, for example, a glass substrate, a crystallized glass substrate, or a plastic substrate. When a thin film transistor that will be formed later is applied to a top emission light-emitting display device or a reflective liquid crystal display device, a ceramic substrate, a semiconductor substrate, a metal substrate, or the like can also be used.

The first insulating film 102 can be formed by using an insulating film such as a silicon oxide film, a silicon nitride film, or a silicon oxynitride ($SiO_xN_y$) film. Subsequently, a semiconductor layer 103 is formed over the first insulating film 102.

The semiconductor layer 103 is formed as follows: a semiconductor film having an amorphous structure is formed by a known method such as a sputtering method, an LPCVD method, or a plasma CVD method; a crystalline semiconductor film that is crystallized by heat treatment is formed; a resist film is formed over the crystalline semiconductor film; and then patterning into a desired shape is performed by using a first resist mask obtained by light exposure and development; and thus, the semiconductor layer 103 is formed.

A thickness of the semiconductor layer 103 is 25 to 80 nm (preferably, 30 to 70 nm). A material for the crystalline semiconductor film is not limited, but silicon, silicon germanium (SiGe) alloy, or the like is preferably used.

As the heat treatment, a heating furnace, laser irradiation, irradiation of light emitted from a lamp instead of laser light (hereinafter referred to as lamp annealing), or a combination thereof can be used.

In addition, the crystalline semiconductor film may also be formed by a thermal crystallization method in which heat treatment is performed after adding a catalyst such as nickel. Further, when the crystalline semiconductor film is obtained by the thermal crystallization method using a catalyst such as nickel, it is preferable to perform gettering treatment for removing a catalyst such as nickel after crystallization.

In addition, when the crystalline semiconductor film is formed by a laser crystallization method, a continuous wave oscillation laser beam (a CW laser beam) or a pulsed oscillation laser beam (a pulsed laser beam) can be used. As a laser beam that can be used here, a laser beam emitted from one or plural kinds of a gas laser such as an Ar laser, a Kr laser, or an excimer laser; a laser using, as a medium, single crystal YAG YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or plural kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used. A crystal grain having a large diameter can be obtained by irradiation of the fundamental wave of the above laser beam or a second harmonic to a fourth harmonic of the fundamental wave. For example, the second harmonic (532 nm) or the third harmonic (355 nm) of a Nd: YVO$_4$ laser (the fundamental wave: 1064 nm) can be used. At this time, energy density of the laser is required to be about 0.01 to 100 MW/cm$^2$ (preferably, 0.1 to 10 MW/cm$^2$). A scanning rate is set to be about 10 to 2000 cm/sec for irradiation.

It is to be noted that, as for a laser using, as a medium, single crystal YAG YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or plural kinds of Nd, Yb, Cr, Ti, Ho, Er, Tm, and Ta as a dopant; an Ar ion laser; or a Ti: sapphire laser, continuous wave oscillation is possible. In addition, pulsed oscillation at a repetition frequency of 10 MHz or more is also possible by performing a Q-switch operation, mode locking, or the like. When pulsed oscillation at a repetition frequency of 10 MHz or more is performed, the semiconductor film can be irradiated with a following pulsed laser after melting of the semiconductor film by a laser and before solidification thereof. Therefore, different from a case where a pulsed laser at a low repetition frequency is used, a solid-liquid interface can be moved continuously in the semiconductor film, and thus, a crystal grain which is grown continuously in a scanning direction can be obtained.

When ceramics (polycrystal) is used as a medium, a medium can be formed into a desired shape in a short time at a low cost. In a case of using a single crystal, generally, a medium with a columnar shape having a diameter of several mm and a length of several tens of mm is used. However, in a case of using ceramics, a larger medium can be formed.

A concentration of a dopant such as Nd or Yb in a medium, which directly contributes to light-emission, cannot be changed largely both in a single crystal and a polycrystal. Therefore, there is a limitation to some extent to improve laser output by increasing the concentration. However, in a case of ceramics, a size of a medium can be extremely larger compared with a single crystal, and thus, it can be expected that the output is improved drastically.

Furthermore, in the case of ceramics, a medium having a parallelepiped shape or a rectangular shape can be easily formed. When oscillation light goes in zigzag inside a medium by using a medium having such a shape, oscillation light path can be made long. Therefore, the light is amplified largely and the laser can be emitted with large output. In addition, since a laser beam emitted from a medium having such a shape has a rectangle cross-sectional shape, it is easier to shape a linear beam compared with a circular beam. By shaping the laser beam emitted as described above using an optical system, a linear beam having a length of 1 mm or less on a narrower side and a length of several mm to several m on a longer side can be easily obtained. Further, by uniformly irradiating the medium with excited light, the linear beam has a uniform energy distribution in a longer side direction.

By irradiating the semiconductor film with this linear beam, the entire surface of the semiconductor film can be more uniformly annealed. When uniform annealing is required for also both ends of the linear beam, an idea of providing a slit for the both ends so as to shield a portion where energy is decayed, or the like is necessary.

When the linear beam with uniform intensity obtained as described above is used for annealing the semiconductor film and an electronic device is manufactured using the semiconductor film, characteristics of the electronic device can be favorable and uniform.

Subsequently, if necessary, doping of a small amount of impurity elements (boron or phosphorus) is performed to the semiconductor layer to control the threshold value of a TFT. Here, an ion doping method in which diborane ($B_2H_6$) is not separated by mass but excited by plasma is used.

Then, after the first resist mask is removed, an oxide film is removed by an etchant containing hydrofluoric acid and the surface of the semiconductor layer is cleaned at the same time. Thereafter, a second insulating film (a gate insulating film) 104 covering the semiconductor layer is formed. The second insulating film 104 is formed by using a plasma CVD method, a sputtering method, or a thermal oxidation method to have a thickness of 1 to 200 nm, preferably, 70 to 120 nm. The second insulating film 104 is formed by using a film including an insulating film such as a silicon oxide film, a silicon nitride film, or a silicon oxynitride film. Here, a silicon oxynitride film (composition ratio is: Si=32%, O=59%, N=7%, and H=2%) is formed to have a thickness of 115 nm by a plasma CVD method.

In addition, after a substrate, an insulating layer as a base film, a semiconductor layer, a gate insulating layer, an interlayer insulating layer, and the like are formed, oxidizing or nitriding may be performed to the surfaces of the substrate, the insulating layer as a base film, the semiconductor layer, the gate insulating layer, and the interlayer insulating layer to be oxidized or nitrided by using plasma treatment. When plasma treatment is used for oxidizing or nitriding the semiconductor layer or the insulating layer, the surfaces of the semiconductor layer or the insulating layer is reformed, and a more dense insulating film compared with an insulating film formed by a CVD method or a sputtering method can be formed. Therefore, defects such as a pin hole are suppressed, and characteristics or the like of a semiconductor device can be improved. In addition, the plasma treatment as described above can also be performed to a gate electrode layer, a source electrode layer, a drain electrode layer, a wiring layer, and the like, and a nitride film or an oxide film can be formed by performing nitriding or oxidizing.

It is to be noted that, when the film is oxidized by plasma treatment, plasma treatment is performed under an oxygen atmosphere (for example, under an atmosphere including oxygen ($O_2$) and a rare gas (including at least one of He, Ne, Ar, Kr and Xe), under an atmosphere including oxygen, hydrogen ($H_2$), and a rare gas, or under an atmosphere including dinitrogen monoxide and a rare gas). On the other hand, when the film is nitrided by plasma treatment, plasma treatment is performed under a nitrogen atmosphere (for example, under an atmosphere including nitrogen ($N_2$) and a rare gas (including at least one of He, Ne, Ar, Kr and Xe), under an atmosphere including nitrogen, hydrogen, and a rare gas, or under an atmosphere including $NH_3$ and a rare gas). As the rare gas, for example, Ar can be used. Further, a mixed gas of Ar and Kr may also be used. Therefore, the insulating film that is formed by plasma treatment contains a rare gas used in the plasma treatment (including at least one of He, Ne, Ar, Kr and Xe), and the insulating film contains Ar in the case of using Ar.

In addition, when plasma treatment is performed to the second insulating film 104, the plasma treatment is performed under an atmosphere of the above described gas where electron density is $1 \times 10^{11}$ cm$^{-3}$ or higher and an electron temperature of plasma is 1.5 eV or lower. More in detail, electron density is $1 \times 10^{11}$ cm$^{-3}$ or higher and $1 \times 10^{13}$ cm$^{-3}$ or lower, and an electron temperature of plasma is 0.5 eV or higher and 1.5 eV or lower. Since electron density of plasma is high and an electron temperature in the vicinity of an object to be processed (here, the second insulating film 104 functioning as a gate insulating layer) formed over the substrate is low, damage due to plasma to the object to be processed can be prevented. Further, an oxide film or a nitride film, which is formed by oxidizing or nitriding the object to be processed using plasma treatment, has excellent uniformity in a thickness and the like and dense film quality compared with a film formed by a CVD method or a sputtering method because electron density of plasma is high, such as $1 \times 10^{11}$ cm$^{-3}$ or higher. In addition, oxidizing or nitriding treatment can be performed at a low temperature compared with conventional plasma treatment or a thermal oxidation method because an electron temperature of plasma is low, such as 1.5 eV or lower. For example, oxidizing or nitriding treatment can be sufficiently performed also by plasma treatment at a temperature that is lower than a strain point of a glass substrate by 100° C. or more. It is to be noted that a frequency for forming plasma can be a high frequency such as a micro wave (2.45 GHz). Hereinafter, the above condition is used for plasma treatment if not otherwise mentioned.

Next, a stacked layer of a first conductive layer 105a and a second conductive layer 106a is formed. The stacked layer is not limited to two layers of the first conductive layer and the second conductive layer, and a stacked layer including three or more layers may also be employed.

The first conductive layer 105a is formed by refractory metal such as tungsten (W), chromium (Cr), tantalum (Ta), tantalum nitride (TaN), or molybdenum (Mo), or alloy or a compound containing the refractory metal as a main component to have a thickness of 20 to 50 nm. In addition, the second conductive layer 106a is formed by the refractory metal such as tungsten (W), chromium (Cr), tantalum (Ta), tantalum nitride (TaN), or molybdenum (Mo), or alloy or a compound containing the refractory metal as a main component to have a thickness of 200 to 600 nm.

Here, two layers, that is, the first conductive layer and the second conductive layer are formed by using different conductive materials, respectively, so that a difference in an etching rate is generated in an etching step that will be carried out later. A TaN film is used as the first conductive layer, and a tungsten film is used as the second conductive layer.

Subsequently, after a resist film is coated over the entire surface of the second conductive layer 106a, light exposure is performed using a mask shown in FIG. 1A. Here, a resist film having a thickness of 1.5 μm is coated, and a light exposure machine in which resolution is 1.5 μm is used for light exposure. Light used for light exposure is an i-line (wavelength: 365 nm), and exposure energy is selected from a range of 20 to 140 mJ/cm$^2$. In addition, light is not limited to an i-line. Light in which an i-line, a g-line (wavelength: 436 nm) and an h-line (wavelength: 405 nm) are mixed may also be used for light exposure.

In FIG. 1A, as for the exposure mask, a light shielding portion 401 formed of a metal film such as Cr and a portion 402 provided with a semi-transmitting film (also referred to as a semi-transmitting portion) as an assist pattern having a function of reducing light intensity are provided over a substrate 400. In a cross-sectional view of the exposure mask, the width of the light shielding portion 401 is referred to as t1, and the width of the portion 402 provided with only the semi-transmitting film is referred to as t2. Here, an example of using the semi-transmitting film as part of the exposure mask is shown; however, a diffraction grating pattern may also be used.

When light exposure is performed to the resist film by using the exposure mask shown in FIG. 1A, a non-exposed region 403a and an exposed region 403b are formed. In light exposure, the exposed region 403b shown in FIG. 1A is formed by light that is conducted below the light-shielding portion 401 and transmitted through the semi-transmitting film.

Figure 1B:
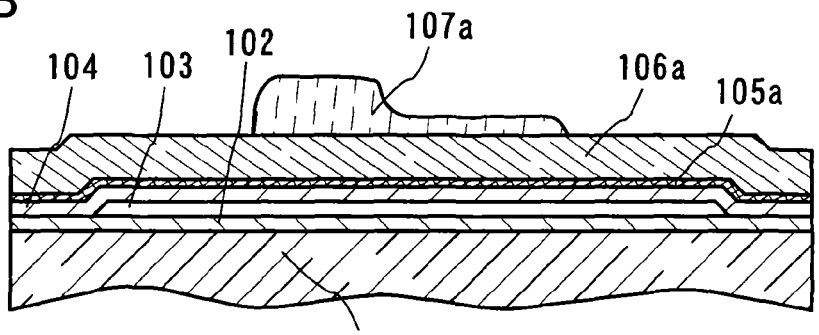

When developing is performed, the exposed region 403b is removed, and as shown in FIG. 1B, an asymmetrical resist pattern 107a having a region with a thick thickness and a region with a thickness that is thinner than that of the above region on one side can be obtained over the second conductive layer 106a. In the asymmetrical resist pattern 107a, a thickness of the resist film in the region with a thin thickness can be controlled by adjusting the exposure energy.

Then, etching of the second conductive layer 106a and the first conductive layer 105a is performed by dry etching. As the etching gas, $CF_4$, $SF_6$, $Cl_2$, or $O_2$ is used. A dry etching apparatus using a high-density plasma source such as ECR (Electron Cyclotron Resonance) or ICP (Inductively Coupled Plasma) is used to improve an etching rate. It is to be noted that the second insulating film 104 is also etched and the thickness becomes partially thin, depending on etching conditions.

Figure 1C:
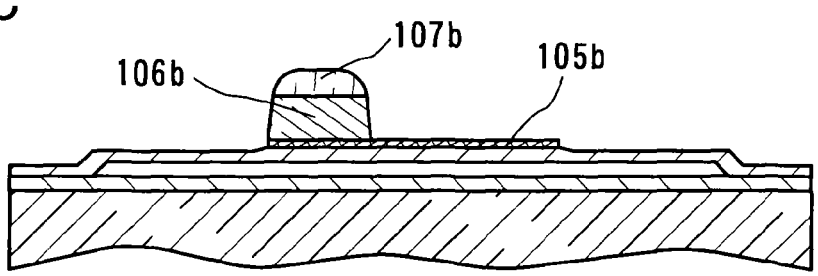

In such a manner, as shown in FIG. 1C, a conductive stacked pattern including the first conductive layer 105b and the second conductive layer 106b is formed over the second insulating film 104. By etching, both sidewalls of the first conductive layer 105b are exposed, and further, a region which is not overlapped with the second conductive layer 106b is exposed. It is to be noted that both sidewalls of the first conductive layer 105b may have a taper shape. Further, both sidewalls of the second conductive layer 106b may also have a taper shape.

Next, after a resist pattern 107b is removed, an impurity having one conductivity type is added to the semiconductor layer 103. Here, phosphorus (or As) is used as an ion of the impurity having one conductivity type, and an n-channel TFT is manufactured. By using the conductive stacked pattern, an LDD region, or a source region or a drain region can be formed in a self-alignment manner without forming a sidewall.

When doping treatment for forming a source region and a drain region provided in the semiconductor layer that is not overlapped with a gate electrode is performed, an ion of an impurity having one conductivity type may be added to the semiconductor layer 103 by using the conductive stacked pattern as a mask to form high-concentration impurity regions 110 and 111 having one conductivity type. An impurity concentration of the high-concentration impurity regions 110 and 111 having one conductivity type is set to be $1 \times 10^{19}$ to $5 \times 10^{21}$/cm$^3$ (the peak value by a SIMS measurement).

In addition, when doping treatment for forming an LDD region overlapped with a gate electrode is performed, an ion of an impurity having one conductivity type is added to the semiconductor layer 103 through the first conductive layer 105b in a region which is not overlapped with the second conductive layer, and thus, a low-concentration impurity region 109 having one conductivity type is formed. In this case, although doping conditions depend on a thickness of the second conductive layer or the first conductive layer, accelerating voltage of 50 kV or higher is necessary as the doping conditions. An impurity concentration of the low-concentration impurity region 109 having one conductivity type is set to be $1 \times 10^{16}$ to $5 \times 10^{18}$/cm$^3$ (the peak value by a SIMS measurement), provided that it is an LDD region.

It is to be noted that the order of doping is not particularly limited, and after performing doping treatment for forming a source region and a drain region, doping treatment for forming an LDD region may be performed. In addition, after performing doping treatment for forming an LDD region, doping treatment for forming a source region and a drain region may be performed.

Although an example in which doping treatment is performed twice separately to form impurity regions having different concentrations is shown here, impurity regions having different concentrations may be formed by one doping treatment by adjusting treatment conditions.

In addition, although an example in which a resist pattern is removed before doping is shown here, a resist pattern may also be removed after doping treatment. When doping is performed with a resist pattern left, doping can be performed while protecting the surface of the second conductive layer with a resist pattern.

It is to be noted that, in the case of the doping treatment, the semiconductor layer in a portion overlapped with the second conductive layer is to be a region to which the ion of the impurity having one conductivity type is not added and functions as a channel formation region of a TFT that will be formed later.

In addition, the conductive stacked pattern (the first conductive layer 105b and the second conductive layer 106b) in a portion intersected with the semiconductor layer 103 becomes a gate electrode. A region of the first conductive layer 105b, which is not overlapped with the second conductive layer 106b, is a length of a Lov region. It is to be noted that the Lov region refers to a low-concentration impurity region overlapped with the gate electrode. The necessary length of the Lov region may be determined in accordance with a type or an application of a circuit included in a TFT, and the exposure mask or etching conditions may be set based on the length.

Thereafter, a third insulating film 112 using silicon nitride is formed. Then, activation and hydrogenation of the impurity element added to the semiconductor layer are performed.

Next, a fourth insulating film 113 is formed by using a light transmitting inorganic material (such as silicon oxide, silicon nitride, or silicon oxynitride) or an organic compound material having a low dielectric constant (a photosensitive or non-photosensitive organic resin material). In addition, the fourth insulating film may be formed by using a material containing siloxane. Siloxane is a material including a skeleton structure formed by a bond of silicon (Si) and oxygen (O). As a substituent, an organic group containing at least hydrogen (for example, an alkyl group or aromatic hydrocarbon) is used. A fluoro group may also be used as a substituent. In addition, as a substituent, both of an organic group containing at least hydrogen and a fluoro group may be used as well.

Then, a mask formed of a resist is formed by using a third photomask, and the third insulating film 112 and the fourth insulating film 113 functioning as an interlayer insulating film, and the second insulating film 104 functioning as a gate insulating film are selectively etched to form a contact hole. After that, the mask formed of a resist is removed.

After a metal stacked film is formed by a sputtering method over the fourth insulating film 113, a mask formed of a resist is formed by using a fourth photomask, and the metal stacked film is selectively etched to form source and drain electrodes 114 and 115 which are in contact with the semiconductor layer.

It is to be noted that a connection electrode (an electrode for electrically connecting plural TFTs) or a terminal electrode (an electrode for connecting to an external power supply) can also be formed at the same time as the source or drain electrode 114 or 115 of a TFT over the fourth insulating film 113. Then, the mask formed of a resist is removed. The metal stacked film has a stacked structure of three layers, such as a Ti film having a thickness of 100 nm, an Al film containing a small amount of Si having a thickness of 350 nm, and a Ti film having a thickness of 100 nm. It is preferable to form the metal stacked film continuously in the same metal sputtering apparatus.

Figure 1D:
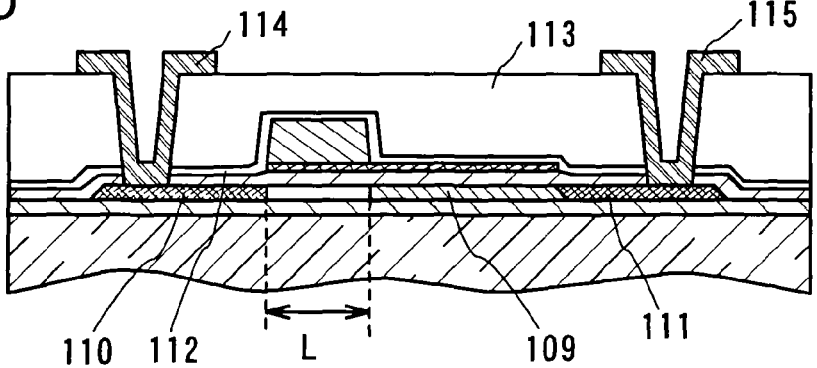

Through the above steps, a top gate TFT having the low-concentration impurity region only on one side of the channel formation region is formed as shown in FIG. 1D. In addition, in FIG 1D, a channel length L is shown.

As described above, in this embodiment mode, light exposure is performed by using a photomask provided with an assist pattern that is formed of a diffraction grating pattern or a semi-transmitting film and has a function of reducing light intensity to form the asymmetrical resist pattern 107a, and by using the resist pattern 107a, the asymmetrical gate electrode is obtained.

Therefore, by adjusting the length of a portion where a thickness of the resist pattern 107a is thin, the length of the Lov region can be adjusted in a self-alignment manner.

For example, in a case of forming an n-channel TFT used for a buffer circuit, the channel length L can be set to be 10 μm and the length of a Lov region can be set to be 1 to 1.5 μm. In this case, the gate electrode width, that is, the width of a conductive stacked pattern (the width in a channel length direction) is set to be 11 to 11.5 μm.

In this embodiment mode, an n-channel TFT is used for the explanation; however, a p-channel TFT can also be formed by using a p-type impurity element instead of an n-type impurity element.

Further, an n-channel TFT and a p-channel TFT can be formed over the same substrate, and by combining these TFTs complementarily, a CMOS circuit can be formed. The CMOS circuit indicates a circuit having at least one n-channel TFT and one p-channel TFT (such as an inverter circuit, a NAND circuit, an AND circuit, a NOR circuit, an OR circuit, a shift register circuit, a sampling circuit, a D/A converter circuit, an A/D converter circuit, a latch circuit, or a buffer circuit). In addition, by combining these CMOS circuits, a memory element such as an SRAM or a DRAM or other elements can be formed over the substrate. Further, a CPU can also be formed over the substrate by integrating various elements or circuits.

In addition, a top gate TFT with the above structure (the structure having a Lov region only on one side of a channel formation region) and a top gate TFT with a structure having Lov regions on both sides of a channel formation region can be formed over the same substrate by only changing an exposure mask without increasing the number of manufacturing steps.

In this embodiment mode, a top gate TFT with a single gate structure is used for the explanation; however, a top gate TFT with a multi gate structure having a plurality of channel formation regions can also be formed. In addition, a top gate TFT with a single gate structure and a top gate TFT with a multi gate structure can be formed over the same substrate by only changing an exposure mask without increasing the number of manufacturing steps.

Therefore, various circuits can be formed over the same substrate by forming transistors with appropriate structures without increasing the number of manufacturing steps.

EMBODIMENT MODE 2

In this embodiment mode, an exposure mask provided with an assist pattern that is formed of a diffraction grating pattern or a semi-transmitting film and has a function of reducing light intensity, which is used in Embodiment Mode 1, will be explained with reference to FIGS. 2A to 2E.

It is to be noted that FIG. 1A shows a cross-sectional view of an exposure mask. Similarly, also in FIGS. 2A to 2E, a width of a light-shielding portion is referred to as t1, and a width of a portion provided with an assist pattern is referred to as t2.

Figure 2A:
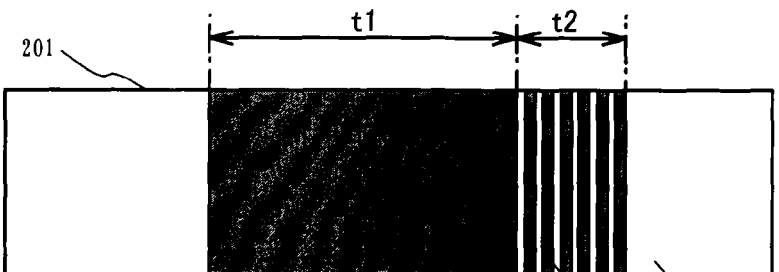
FIGS. 2A, 2B and 2D are top views each showing an exposure mask
Figure 2B:
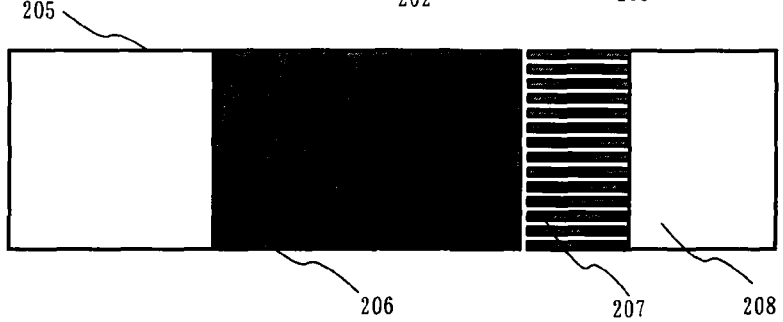
Figure 2C:
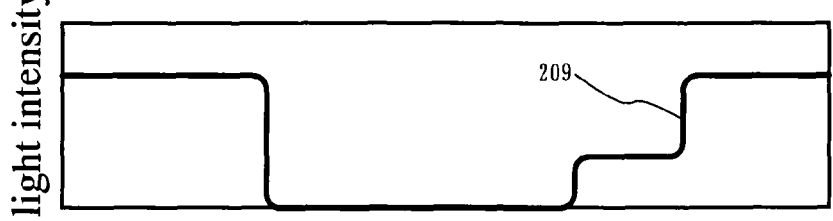
FIGS. 2C and 2E are views each showing a light intensity distribution of an exposure mask (Embodiment Mode 2)

As specific examples of the assist pattern, FIGS. 2A and 2B show part of top views of an exposure mask provided with a diffraction grating pattern having a slit portion formed of a line and a space, which are equal to or lower than a resolution limit of an exposure apparatus. A slit direction of the slit portion may be parallel to a direction of a main pattern (a light-shielding portion 202) like a slit portion 203, or may be perpendicular to a direction of a main pattern (a light-shielding portion 206) like a slit portion 207. It is to be noted that, since it is difficult to employ a negative type resist as a resist used in this photolithography step, a pattern structure of a photomask or a reticle for forming a gate electrode is based on a positive type resist.

When a photomask or a reticle 201 or 205 for forming a gate electrode is irradiated with exposure light, light intensity is approximately zero in a light shielding portion 202 or 206 and light intensity is approximately 100% in a light-transmitting portion 204 or 208. On the other hand, light intensity of an assist pattern that has a function of reducing light intensity, which is formed of a slit portion 203 or 207 of a diffraction grating pattern including a line or a space equal to or lower than a resolution limit of an exposure apparatus, can be adjusted in a range of 10 to 70%. A typical example of a light intensity distribution is shown in a light intensity distribution 209 in FIG. 2C. Adjustment of light intensity of the slit portion 203 or 207 in the diffraction grating pattern can be realized by adjustment of a pitch and a slit width of the slit portion 203 or 207.

Figure 2D:
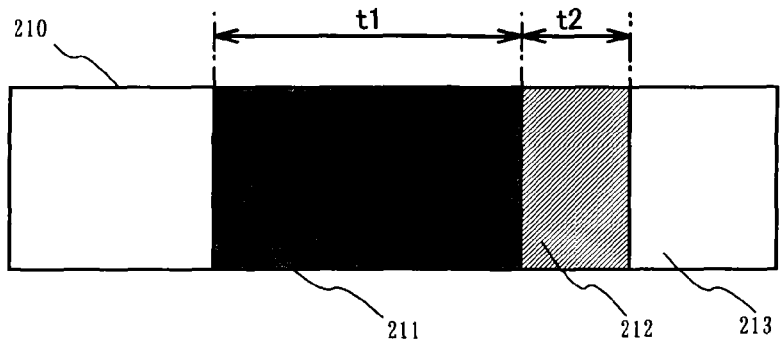
Figure 2E:
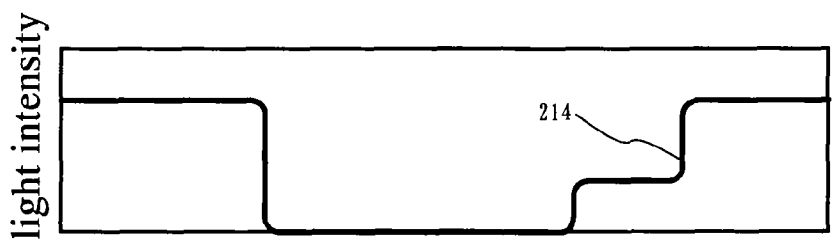

In addition, as a specific example of an assist pattern, FIG. 2D shows part of a top view of an exposure mask provided with a semi-transmitting portion formed of a semi-transmitting film having a function of reducing light intensity of exposure light. As a semi-transmitting film, in addition to MoSiN, MoSi, MoSiO, MoSiON, CrSi or the like can be used. An exposure method using an exposure mask provided with a semi-transmitting portion is also referred to as a half tone exposure method.

A region of a main pattern of a mask pattern for forming a gate electrode in a photomask or a reticle 210 for forming a gate electrode is a light-shielding portion 211, a region of an assist pattern having a function of reducing light intensity is a semi-transmitting portion 212 formed of a semi-transmitting film, and a region on the external side is a light-transmitting portion 213.

When the photomask or the reticle 210 for forming a gate electrode is irradiated with exposure light, light intensity is approximately zero in the light shielding portion 211 and light intensity is approximately 100% in the light-transmitting portion 213. Light intensity of the assist pattern region formed by the semi-transmitting portion 212 formed of a semi-transmitting film can be adjusted in a range of 10 to 70%. A typical example of a light intensity distribution is shown in a light intensity distribution 214 in FIG. 2E.

Further, this embodiment mode can be freely combined with Embodiment Mode 1.

EMBODIMENT MODE 3

A method for forming a conductive stacked pattern shown in Embodiment Mode 1 is not particularly limited. Here, an example of forming a conductive stacked pattern by changing etching conditions several times during the steps will be explained with reference to FIGS. 3A to 3F.

Figure 3A:
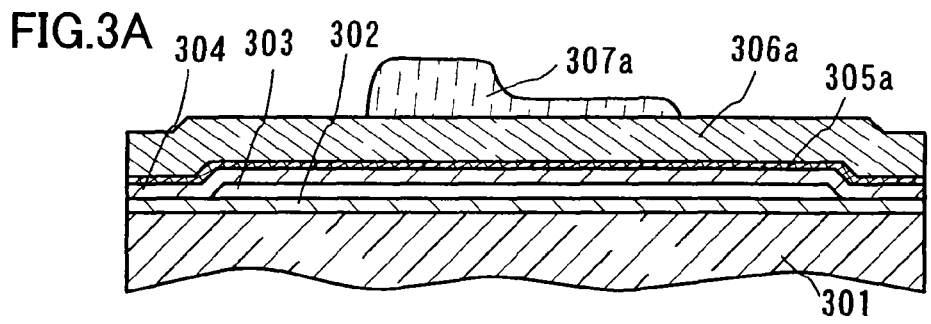
FIGS. 3A to 3F are cross-sectional views each showing a manufacturing step of a semiconductor device (Embodiment Mode 3)

First, similarly to Embodiment Mode 1, a resist pattern 307a is formed over a second conductive layer 306a. FIG. 3A corresponds to FIG. 1B.

In FIG. 3A, over a substrate 301, a first insulating film (a base insulating film) 302, a semiconductor layer 303, a second insulating film (a gate insulating film) 304, a first conductive layer 305a, and the second conductive layer 306a are formed.

Figure 3B:
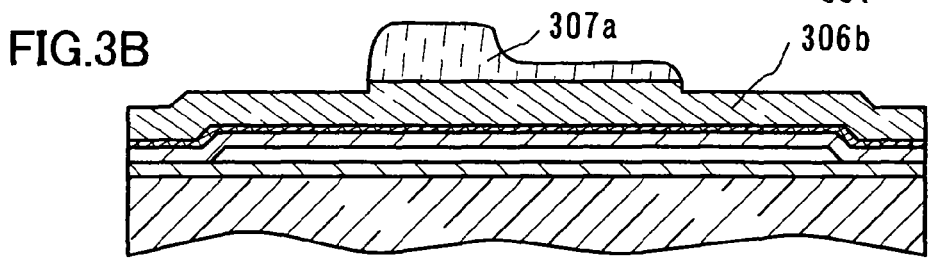

Then, as shown in FIG. 3B, etching is performed with a first etching condition using the resist pattern 307a as a mask to remove part of the second conductive layer, and thus, a second conductive layer 306b is formed. It is to be noted that the second conductive layer 306b is formed over the entire surface at this point.

Figure 3C:
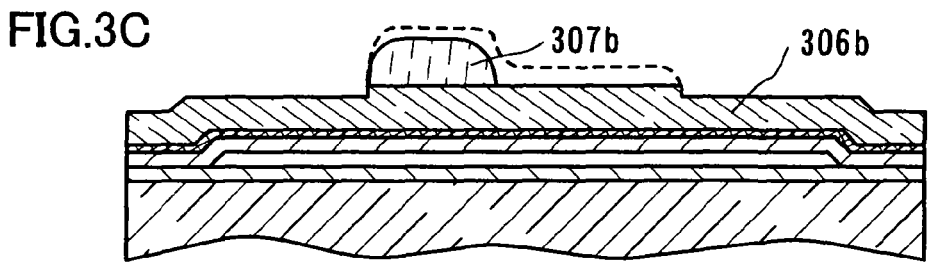

Next, as shown in FIG. 3C, trimming of a resist pattern is performed with a second etching condition to form a resist pattern 307b. It is to be noted that trimming is not required to be performed when the resist pattern is etched and almost the same shape as the resist pattern 307b can be obtained by the first etching. Further, a thickness of a resist formed by coating may be made to be thin in advance so that trimming is not required. The trimming described here refers to processing of a size of a resist pattern by etching the resist pattern.

Figure 3D:
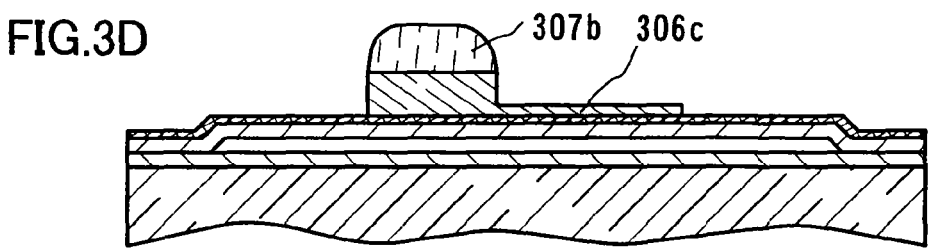

Subsequently, as shown in FIG. 3D, part of the second conductive layer is removed with a third etching condition using the resist pattern 307b as a mask to expose part of the first conductive layer. A cross-sectional shape of the second conductive layer 306c at this point is an L-shape.

Figure 3E:
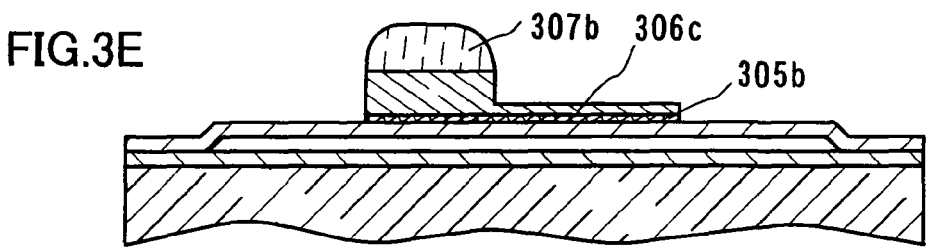

Then, as shown in FIG. 3E, part of the first conductive layer is removed with a fourth etching condition using the second conductive layer 306c as a mask to expose part of the second insulating film 304. At this point, a first conductive layer 305b has the same width as that of the second conductive layer 306c. The second insulating film is protected by being covered with the first conductive layer until this etching with the fourth etching condition.

Figure 3F:
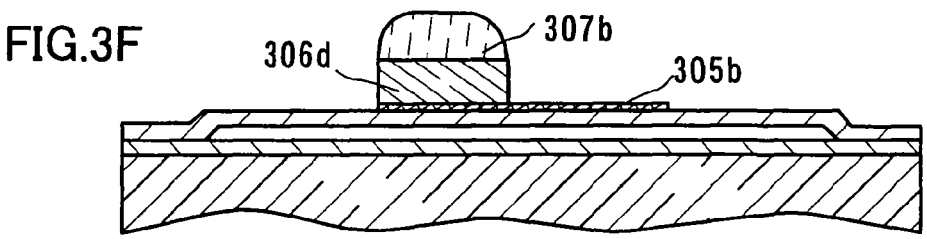

Next, as shown in FIG. 3F, anisotropic etching is performed with a fifth etching condition to form a second conductive layer 306d. In this anisotropic etching, it is important that a difference in an etching rate is large between the first conductive layer and the second conductive layer, and it is preferable to use different conductive materials for the first conductive layer and the second conductive layer. In addition, by adjusting the fifth etching condition, it is also possible to prevent the second insulating film from becoming partially thin by this anisotropic etching.

As described above, when the conductive stacked pattern is formed by changing etching conditions finely, variations in a shape of the conductive stacked pattern can be suppressed.

The subsequent steps are the same as Embodiment Mode 1, and thus, a detailed explanation is omitted here.

Further, this embodiment mode can be freely combined with embodiment mode 1 or 2.

EMBODIMENT MODE 4

Figure 4A:
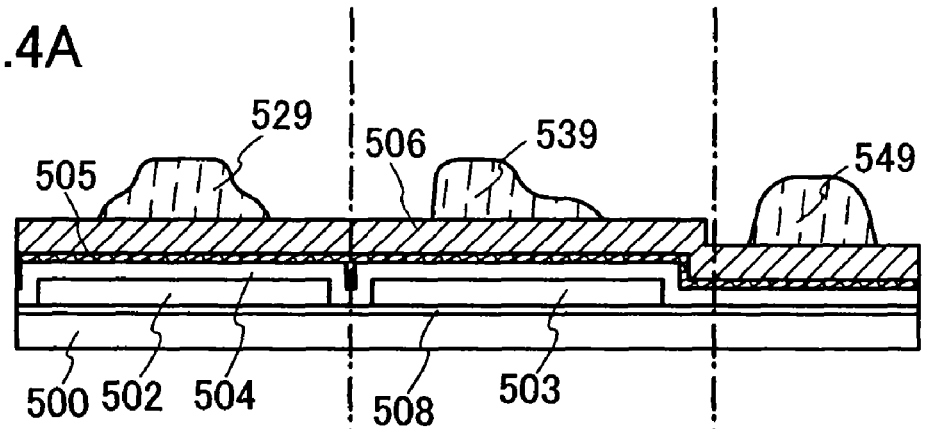
FIGS. 4A to 4C are cross-sectional views each showing a manufacturing step of a semiconductor device (Embodiment Mode 4)
Figure 4B:
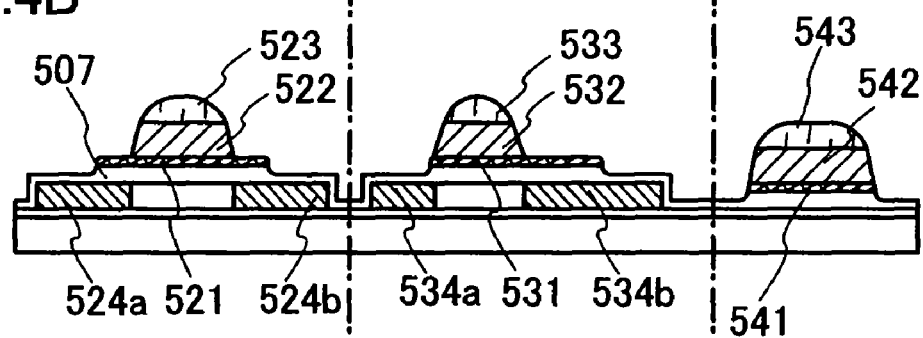
Figure 4C:
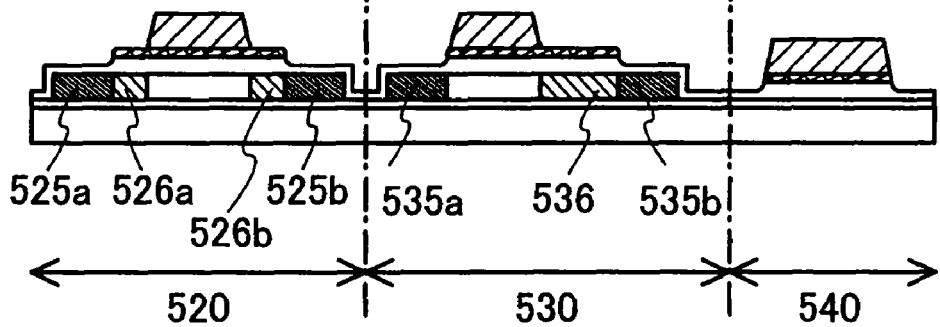

In this embodiment mode, FIGS. 4A to 4C show an example of forming a top gate TFT with the above structure (the structure having a Lov region only on one side of a channel formation region) and a top gate TFT with a structure having Lov regions on both sides of a channel formation region over the same substrate by only changing an exposure mask without increasing the number of manufacturing steps.

In FIG. 4A, semiconductor layers 502 and 503 are formed over a substrate 500 and an insulating layer 508. A gate insulating layer 504, a first conductive film 505, and a second conductive film 506 are formed to cover the semiconductor layers 502 and 503, and resist patterns 529, 539, and 549 having different shapes are formed. These resist patterns can be formed by using the exposure mask as shown in Embodiment Mode 1 or 2.

The resist pattern 529 has a shape having gentle stepped portions on both sides (a symmetrical shape), the resist pattern 539 has a shape having a convex portion in a position which is shifted from a center (an asymmetrical shape), and the resist pattern 549 has a shape without stepped portions and concavity and convexity (a symmetrical shape).

Patterning is performed by etching treatment using the resist patterns 529, 539, and 549, and a first gate electrode layer 521, a second gate electrode layer 522, a first gate electrode layer 531, a second gate electrode layer 532, a first wiring layer 541, and a second wiring layer 542 are formed. When these electrode layers are formed, the gate insulating layer 504 is also etched to some extent, and a gate insulating layer 507 is formed. By also etching the gate insulating layer 504 to some extent, an etching residue of the conductive film can be eliminated; and further, when a contact hole that reaches the semiconductor layer is formed in a subsequent step, a thickness of the gate insulating layer in a portion where the contact hole is formed can be thin, and thus, an etching time can be shortened.

An impurity element having one conductivity type is added to the semiconductor layers 502 and 503 using the second gate electrode layers 522 and 532 as masks to form low-concentration impurity regions 524a, 524b, 534a, and 534b (see FIG. 4B).

Further, an impurity element having one conductivity type is added to the semiconductor layers 502 and 503 using the first gate electrode layer 521, the second gate electrode layer 522, the first gate electrode layer 531, and the second gate electrode layer 532 as masks to form high-concentration impurity regions 525a and 525b, low-concentration impurity region 526a and 526b, high-concentration impurity regions 535a and 535b, and a low-concentration impurity region 536.

Then, resist patterns 523, 533, and 543 are removed.

In this manner, a first TFT portion 530, a second TFT portion 520, and a wiring portion 540 can be formed over the same substrate. A TFT having the low-concentration impurity region 536 only on one side of a channel formation region is formed in the first TFT portion 530. A TFT having the low-concentration impurity regions 526a and 526b on both sides of a channel formation region is formed in the second TFT portion 520 (refer to FIG. 4C). In addition, a stacked layer in which end portions are in alignment, that is, a stacked layer of the first wiring layer 541 and the second wiring layer 542 is obtained in the wiring portion 540.

In addition, by using the same resist pattern, the same structure as in the first TFT portion 530 can be formed so that a capacitor and a TFT can be formed over the same substrate. A capacitor including the gate insulating layer 504 as a dielectric, and the low-concentration impurity region 536, and the first gate electrode layer 531 and the second gate electrode layer 532 as a pair of electrodes can also be formed.

Further, this embodiment mode can be freely combined with Embodiment Mode 1, 2, or 3.

EMBODIMENT MODE 5

In this embodiment mode, a structure of an active matrix light-emitting device will be explained hereinafter with reference to FIGS. 5 and 6 with a manufacturing method thereof.

First, over a substrate 610 having an insulating surface, a base insulating film is formed. When light-emission is extracted with the substrate 610 side as a display surface, the substrate 610 may be a glass substrate or a quartz substrate having a light-transmitting property. Further, a light-transmitting plastic substrate having a heat resistant property which can resist a processing temperature may also be used. On the other hand, when light-emission is extracted with an opposite surface to the substrate 610 side as a display surface, a silicon substrate, a metal substrate, or a stainless steel substrate covered with an insulating film may also be used in addition to the above substrates. Here, the substrate 610 is a glass substrate. It is to be noted that a refractive index of the glass substrate is around 1.55.

As a base insulating film 611, a base film formed of an insulating film such as a silicon oxide film, a silicon nitride film, or a silicon oxynitride film is formed. Here, an example of using a single layer structure as the base film is shown; however, a structure of stacking two or more of the insulating layers may also be employed. It is to be noted that the base insulating film is not required to be formed when concavity and convexity of the substrate and impurity diffusion from the substrate are not concerned.

Subsequently, a semiconductor layer is formed over the base insulating film. The semiconductor layer is formed as follows: after a semiconductor film having an amorphous structure is formed by a known method such as a sputtering method, an LPCVD method, or a plasma CVD method, a crystalline semiconductor film obtained by performing known crystallization treatment such as a laser crystallization method, a thermal crystallization method, or a thermal crystallization method using a catalyst such as nickel is patterned into a desired shape by using a first photomask, and thus, the semiconductor layer is formed. It is to be noted that the base insulating film and the semiconductor film having an amorphous structure can be stacked continuously without being exposed to atmospheric air by using a plasma CVD method. A thickness of the semiconductor film is 25 to 80 nm (preferably 30 to 70 nm). A material for the crystalline semiconductor film is not particularly limited, but silicon or silicon-germanium (SiGe) alloy is preferably used.

Here, as a technique for crystallizing the semiconductor film having an amorphous structure, a technique disclosed in Japanese Patent Laid-Open No.: H8-78329 is used. According to the technique disclosed in this publication, a metal element which promotes crystallization is selectively added to the amorphous silicon film, and a semiconductor film having a crystal structure expanding from the added region is formed by performing heat treatment.

Hereinafter, one example of a method for forming a crystalline semiconductor film is explained in detail.

First, a nickel acetate solution containing a metal element having catalysis for promoting crystallization (nickel here) of 1 to 100 ppm in weight is coated using a spinner over the surface of the semiconductor film having an amorphous structure, and a nickel-containing layer is formed. As an alternative method for forming the nickel-containing layer other than the coating, a method for forming an extremely thin film by a sputtering method, an evaporation method or plasma treatment may be employed. In addition, although the example of coating over the entire surface is shown here, the nickel-containing layer may also be selectively formed by using a mask.

Then, heat treatment is performed for crystallization. In this case, a silicide is formed in a portion of the semiconductor film that is in contact with the metal element for promoting crystallization of the semiconductor, and crystallization is progressed by using the silicide as a nucleus. In this manner, a semiconductor film having a crystal structure is obtained. It is to be noted that the concentration of oxygen contained in the semiconductor film after the crystallization is desirably $5 \times 10^{18}/cm^3$ or lower. Here, after performing heat treatment for dehydrogenation (450° C. for 1 hour), heat treatment for crystallization (550 to 650° C. for 4 to 24 hours) is performed. In a case of performing crystallization by using intense light irradiation, any one of infrared light, visible light and ultraviolet light, or combination thereof can be used. It is to be noted that, if necessary, heat treatment for discharging hydrogen contained in the semiconductor film having an amorphous structure may be performed before the intense light irradiation. Alternatively, heat treatment and intense light irradiation may be performed at the same time for crystallization. In view of productivity, crystallization is desirably performed by intense light irradiation.

In the crystalline semiconductor film obtained in such a manner, a metal element (nickel here) remains. Although the metal element is not uniformly distributed in the film, it remains in a concentration over $1 \times 10^{19}/cm^3$ on average. Needless to say, various semiconductor elements such as TFTs can be formed even in such a state; however, the metal element is removed by gettering as will be described below.

Here, a natural oxide film formed in the crystallization step is removed before laser light irradiation. This natural oxide film contains nickel in a high concentration; therefore, it is preferably removed.

Then, in order to increase the degree of crystallization (degree of the crystallized component in the total volume of the film) and compensate defects remaining in the crystal grains, the crystalline semiconductor film is irradiated with laser light. In a case of irradiating the crystalline semiconductor film with laser light, distortions or ridges are formed in the semiconductor film, and a thin surface oxide film is formed over the surface (not shown in the drawing). As the laser light for this case, an excimer laser light of a wavelength of 400 nm or less that is emitted from a laser light source as a pulse oscillator, or the second or third harmonic of a YAG laser may be employed. Alternatively, the second to fourth harmonics of the fundamental wave may be utilized by the use of a solid-state laser capable of continuous wave oscillation. Typically, the second harmonic (532 nm) or the third harmonic (355 nm) of a Nd: YVO$_4$ laser (fundamental wave: 1064 nm) may be employed.

Subsequently, first heat treatment (heat treatment for heating the semiconductor film at about 400 to 1000° C. momentarily) to reduce distortions of the crystalline semiconductor film is performed in a nitrogen atmosphere, and a flat semiconductor film is obtained. As the heat treatment for heating momentarily, heat treatment by intense light irradiation or heat treatment to put the substrate into a heated gas and take out the substrate after a few minutes may be employed. Depending on conditions of the heat treatment, distortions are reduced at the same time as defects remained in the crystal grains are compensated, that is, improvement of crystallinity can be carried out. Further, by this heat treatment, distortions are reduced, and thus, nickel can be easily gettered in a subsequent gettering step. It is to be noted that, when a temperature in the heat treatment is lower than a temperature in crystallization, nickel moves in a silicon film of a solid phase state.

Then, a semiconductor film containing a rare gas element is formed over the crystalline semiconductor film. An oxide film to serve as an etching stopper (referred to as a barrier layer) may be formed to have a thickness of 1 to 10 nm before forming the semiconductor film containing a rare gas element. The barrier layer may be formed at the same time as heat treatment to reduce distortions of the semiconductor film.

The semiconductor film containing a rare gas element is formed by a plasma CVD method or a sputtering method, and a gettering site having a thickness of 10 to 300 nm is formed. The rare gas element is one or plural kinds of elements selected from helium (He), neon (Ne), argon (Ar), krypton (Kr) and xenon (Xe). Among them, argon (Ar) that is an inexpensive gas is preferable.

Here, a PCVD method is used. As a material gas, monosilane and argon are used, in which a ratio (monosilane:argon) is controlled to be 0.1:99.9 to 1:9, preferably, 1:99 to 5:95. RF power density in deposition is desirably 0.0017 to 0.48 W/cm$^2$. It is preferable that the RF power density be as high as possible because the quality of the film is improved enough to obtain gettering effect, and further, the deposition rate is improved. In addition, it is preferable that the pressure during the deposition be controlled to be 1.333 Pa (0.01 Torr) to 133.322 Pa (1 Torr). The pressure is desirably as high as possible because the deposition rate is improved. Further, the deposition temperature is preferably controlled to be 300 to 500° C. In this manner, the semiconductor film can be formed by a plasma CVD method, which contains argon in a concentration of $1\times10^{18}$ to $1\times10^{22}$/cm$^3$, preferably $1\times10^{20}$ to $1\times10^{21}$/cm$^3$. By controlling the deposition condition for the semiconductor film within the ranges described above, damage to the barrier layer during the deposition can be reduced so that variation in a thickness of the semiconductor film and defects such as holes formed in the semiconductor film can be prevented.

There are two meanings in the inclusion of an ion of a rare gas element that is an inert gas in the film. One is that a dangling bond is formed, and the other is that distortion is given to the semiconductor film. In order to give the distortion to the semiconductor film, it is remarkably effective to use an element that has a larger atomic radius than that of silicon, such as argon (Ar), krypton (Kr), or xenon (Xe). In addition, by containing the rare gas element into the film, not only lattice distortion but also a dangling bond is formed to contribute to gettering action.

Subsequently, heat treatment is performed for gettering to reduce the concentration of the metal element (nickel) in the crystalline semiconductor film, or removing the metal element. As the heat treatment for gettering, treatment using intense light irradiation, heat treatment using a furnace, or heat treatment to put the substrate into a heated gas and take out the substrate after several minutes may be employed. Here, the second heat treatment for gettering (treatment to heat the semiconductor film at 400 to 1000° C. momentarily) is performed in a nitrogen atmosphere.

By the second heat treatment, the metal element moves to the semiconductor film containing a rare gas element, and the metal element contained in the crystalline semiconductor film covered with a barrier layer is removed or the concentration of the metal element is reduced. The metal element contained in the crystalline semiconductor film moves in a direction that is perpendicular to the substrate surface and toward the semiconductor film containing a rare gas element.

A distance of the move of the metal element in gettering may be a distance of approximately equal to the thickness of the crystalline semiconductor film, and thus, gettering can be performed in a relatively short time. Here, nickel is moved to the semiconductor film containing a rare gas element so that nickel is not segregated in the crystalline semiconductor film, and gettering is sufficiently performed so that the crystalline semiconductor film contains almost no nickel, that is, the nickel concentration in the film is $1\times10^{18}$/cm$^3$ or lower, desirably, $1\times10^{17}$/cm$^3$ or lower. In addition, not only the semiconductor film containing a rare gas element but also the barrier layer functions as a gettering site.

Subsequently, only the semiconductor film containing a rare gas element is selectively removed using the barrier layer as an etching stopper. As a method to selectively etch only the semiconductor film containing a rare gas element, dry etching without using plasma by ClF$_3$, or wet etching using an alkali solution such as an aqueous solution containing hydrazine or tetraethylammonium hydroxide ((CH$_3$)$_4$NOH) (abbreviation: TMAH) can be used. It is to be noted that an over etching time is made shorter so as to prevent a pin hole from being formed in the crystalline semiconductor film by this etching.

Next, the barrier layer is removed by an etchant containing hydrofluoric acid.

In addition, after performing the first heat treatment to reduce distortions of the crystalline semiconductor film, flushing treatment using a flush substance may be performed to remove an impurity such as F. For example, flushing treatment is performed as follows: a PCVD apparatus is used, and monosilane is used as a flush substance and introduced continuously into a chamber at a gas flow rate of 8 to 10 SLM for 5 to 20 minutes, preferably, 10 to 15 minutes to perform flushing treatment to the substrate surface (also referred to as silane flush). It is to be noted that 1 SLM is 1000 sccm, that is, 0.06 m³/h. In addition, it is preferable to use a PCVD apparatus because flushing treatment and formation of the semiconductor film containing a rare gas element can be continuously performed.

Through the above steps, a favorable crystalline semiconductor film can be obtained.

After the crystalline semiconductor film is patterned into a desired shape using a first photomask, the resist mask is removed. Subsequently, if necessary, doping of a small amount of an impurity element (boron or phosphorus) is performed to the semiconductor layer to control the threshold value of a TFT. Here, an ion doping method in which diborane ($B_2H_6$) is not separated by mass but excited by plasma is used.

Then, an oxide film over the surface of the semiconductor layer is removed by using an etchant containing hydrofluoric acid, and at the same time, the surface of the semiconductor layer is cleaned.

Next, an insulating film covering the semiconductor layer is formed. The insulating film is formed by a plasma CVD method or a sputtering method to have a thickness of 1 to 200 nm. The insulating film is preferably formed to have a thin thickness of 10 to 50 nm in a single layer structure or a stacked layer structure of an insulating film containing silicon, and then, surface nitriding treatment using microwave plasma is performed. The insulating film functions as a gate insulating film of a TFT that will be formed later.

Subsequently, over the insulating film, a first conductive film having a thickness of 20 to 100 nm and a second conductive film having a thickness of 100 to 400 nm are stacked. In this embodiment mode, a tantalum nitride film having a thickness of 50 nm and a tungsten film having a thickness of 370 nm are sequentially stacked over an insulating film 613, and patterned as shown in Embodiment Mode 1 to form each gate electrode and each wiring. In this embodiment mode, a photomask or a reticle provided with an assist pattern that is formed of a diffraction grating pattern or a semi-transmitting film and has a function of reducing light intensity is used to form each gate electrode and each wiring.

It is to be noted that the conductive film has a stacked layer structure of a TaN film and a W film here; however, the conductive film may also be formed by stacking an element selected from Ta, W, Ti, Mo, Al, and Cu, or an alloy material or a compound material containing the element as a main component without particular limitations. In addition, a semiconductor film typified by a polycrystal silicon film doped with an impurity element such as phosphorus may also be used. Further, it is not limited to a two-layer structure, and for example, a three-layer structure in which a tungsten film having a thickness of 50 nm, an aluminum-silicon alloy (Al-Si) film having a thickness of 500 nm, and a titanium nitride film having a thickness of 30 nm are sequentially stacked may also be employed.

An ICP (Inductivity Coupled Plasma) etching method may be used for etching the first conductive film and the second conductive film (first etching treatment and second etching treatment). An ICP etching method is used and etching conditions (the amount of power applied to a coil-shaped electrode, the amount of power applied to an electrode on a substrate side, an electrode temperature on a substrate side, and the like) are appropriately adjusted, and thus, the film can be etched into a desired shape.

First doping treatment in which doping is performed to the entire surface using the gate electrode as a mask is performed to add an impurity element which imparts n-type conductivity to the semiconductor layer. The first doping treatment may be performed by an ion doping method or an ion injection method. The ion doping method is performed under the condition where the dose amount is $1.5 \times 10^{13}$ atoms/cm² and the accelerating voltage is in a range of 50 to 100 kV. As the impurity element which imparts n-type conductivity, phosphorus (P) or arsenic (As) is typically used.

After forming a mask formed of a resist, second doping treatment for doping the semiconductor layer with an impurity element which imparts n-type conductivity in a high-concentration is performed. The mask is provided to protect a channel formation region of the semiconductor layer forming a p-channel TFT in a pixel portion and a region in the periphery thereof, part of an n-channel TFT in a pixel portion, and a channel formation region of the semiconductor layer forming a p-channel TFT in a driver circuit portion and a region in the periphery thereof.

The second doping treatment is performed by an ion doping method under the condition where the dose amount is $1 \times 10^{13}$ to $5 \times 10^{15}$/cm² and the accelerating voltage is in a range of 60 to 100 kV.

Then, after removing the mask, a mask formed of a resist is newly formed, and third doping treatment for doping the semiconductor layer with an impurity element which imparts p-type conductivity (typically, boron) in a high-concentration is performed. The mask is provided to protect a channel formation region of the semiconductor layer forming an n-channel TFT in a pixel portion and a region in the periphery thereof, and a channel formation region of the semiconductor layer forming an n-channel TFT in a driver circuit portion and a region in the periphery thereof.

Thereafter, the resist mask is removed. Through the above steps, an impurity region having n-type or p-type conductivity is formed in each semiconductor layer.

Subsequently, after an insulating film containing hydrogen is formed by a sputtering method, an LPCVD method, a plasma CVD method or the like, activation and hydrogenation of an impurity element added to the semiconductor layer are performed. The insulating film containing hydrogen is formed by using a silicon nitride oxide film (SiNO film) obtained by a PCVD method. Here, a thickness of the insulating film containing hydrogen is set to be 50 to 200 nm. In addition, when the semiconductor film is crystallized using a metal element which promotes crystallization such as nickel, gettering for reducing nickel in a channel formation region can be performed at the same time as activation. It is to be noted that the insulating film containing hydrogen is a first layer of an interlayer insulating film and contains silicon oxide.

Then, an inorganic insulating film is formed to be a second layer of the interlayer insulating film by a sputtering method, an LPCVD method, a plasma CVD method, or the like. As the inorganic insulating film, a single layer structure or a stacked layer structure of an insulating film such as a silicon oxide film, a silicon nitride film or a silicon oxynitride film is used. Here, a thickness of the inorganic insulating film is set to be 600 to 800 nm.

Next, a mask formed of a resist is formed by using a photomask, and a contact hole is formed by selectively etching the insulating film. Then, the mask formed of a resist is removed.

After stacking a metal film by a sputtering method, a mask formed of a resist is formed by using a photomask, the stacked metal film is selectively etched, and an electrode functioning as a source electrode or a drain electrode of a TFT is formed. It is to be noted that the stacked metal film is continuously formed in the same metal sputtering apparatus. Then, the mask formed of a resist is removed.

Through the above steps, top gate TFTs 636, 637, 638 and 639 including a polysilicon film as an active layer can be manufactured over the same substrate.

It is to be noted that the TFT 638 provided in the pixel portion is an n-channel TFT having a plurality of channel formation regions in one TFT. Further, the TFT 638 is a double gate TFT. In addition, in the pixel portion, the TFT 639 electrically connected to a light-emitting element that will be formed later is provided. Here, in order to reduce off current, a double gate p-channel TFT is shown as the TFT 639; however, a single gate TFT may also be used without particular limitations.

In addition, the TFT 636 provided in the driver circuit portion is an n-channel TFT having a low-concentration impurity region overlapped with the gate electrode (also referred to as a Lov region) only on a drain side. Further, the TFT 637 is a p-channel TFT having low-concentration impurity regions overlapped with the gate electrode (Lov regions) on both of a source side and a drain side. Each of the both TFTs is a single gate TFT. In the driver circuit portion, a CMOS circuit is formed by connecting the TFTs 636 and 637 complementarily, and various kinds of circuits can be achieved. If necessary, a multi gate TFT can be employed.

Then, a first electrode 623, that is, an anode (or a cathode) of an organic light-emitting element is formed. As the first electrode 623, a single layer film or a stacked layer film of a material having a high work function such as an element selected from Ni, W, Cr, Pt, Zn, Sn, In and Mo, or an alloy material containing the element as a main component such as TiN, $TiSi_xN_y$, $WSi_x$, $WN_x$, $WSi_xN_y$, or NbN may be used to have a total thickness in a range of 100 to 800 nm.

Specifically, the first electrode 623 may be formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, and the like can be used. Indium tin oxide (ITO), indium zinc oxide (IZO), indium tin oxide doped with silicon oxide (ITSO), and the like can also be used as a matter of course.

An example of a composition ratio in each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

Then, an insulating film obtained by a coating method (for example, an organic resin film) is patterned to form an insulator 629 covering an end portion of the first electrode 623 (referred to as a bank, a partition wall, a barrier, an embankment, or the like). It is to be noted that the insulator 629 may also be formed only by light exposure and development using a photosensitive material without being limited to patterning using a mask.

Then, a layer 624 containing an organic compound is formed by an evaporation method or a coating method.

The layer 624 containing an organic compound is a stacked layer, and a buffer layer may also be used as one layer of the layer 624 containing an organic compound. The buffer layer is formed by using a composite material of an organic compound and an inorganic compound, and the inorganic compound has an electron-accepting property with respect to the organic compound. As the inorganic compound, one or a plurality of titanium oxide, zirconium oxide, hafnium oxide, vanadium oxide, niobium oxide, tantalum oxide, chromium oxide, molybdenum oxide, tungsten oxide, manganese oxide and rhenium oxide can be used. The buffer layer may be formed by a composite material of an organic compound having a hole-transporting property and an inorganic compound.

For example, a stacked layer containing an organic compound (a stacked layer of a buffer layer and an organic compound layer) is preferably provided between the first electrode 623 and a second electrode. The buffer layer is a composite layer including metal oxide (molybdenum oxide, tungsten oxide, rhenium oxide, or the like) and an organic compound. The organic compound is a material having a hole-transporting property such as 4,4'-bis[N-(3-methylphenyl)-N-phenylamino]biphenyl (abbreviation: TPD), 4,4'-bis[N-(1-naphthyl)-N-phenylamino]biphenyl (abbreviation: α-NPD), or 4,4'-bis{N-[4-(N,N-di-m-tolylamino)phenyl]-N-phenylamino}biphenyl (abbreviation: DNTPD). Further, for example, the organic compound layer can be formed by using tris(8-quinolinolato)aluminum (abbreviation: $Alq_3$), tris(4-methyl-8-quinolinolato)aluminum (abbreviation: $Almq_3$), or α-NPD. In addition, a dopant material may also be contained in the organic compound layer, and for example, N,N'-dimethylquinacridone (abbreviation: DMQd), coumarin 6, rubrene, or the like can be used. The stacked layer containing an organic compound provided between the first electrode and the second electrode may be formed by an evaporation method such as a resistance heating method.

By adjusting a thickness of the buffer layer, a distance between the first electrode and the organic compound layer can be controlled, and thus, light-emitting efficiency can be enhanced. By adjusting a thickness of the buffer layer, an excellent image in which a light-emission color of each light-emitting element is clearly displayed can be displayed and a light-emitting device with low power consumption can be achieved.

Next, a second electrode 625, that is, a cathode (or an anode) of an organic light-emitting element is formed. As the second electrode 625, alloy such as MgAg, MgIn, or AlLi, or a transparent conductive film (such as ITO) can be used.

Then, a protective layer 626 is formed by an evaporation method or a sputtering method. The protective layer 626 protects the second electrode 625. When light-emission of a light-emitting element is extracted through the protective layer 626, a transparent material is preferably used. If not necessary, the protective layer 626 is not required to be provided.

Subsequently, a sealing substrate 633 is attached with a sealing material 628 to seal a light-emitting element. In other words, a display region is surrounded by the sealing material, and the light-emitting display device is sealed by a pair of substrates. The interlayer insulating film of a TFT is provided over the entire surface of the substrate. Therefore, when a pattern of the sealing material is drawn inside the periphery of the interlayer insulating film, there is a concern that moisture or an impurity enters from part of the interlayer insulating film that is provided outside the pattern of the sealing material. Thus, the periphery of the insulating film that is used as an interlayer insulating film of a TFT is provided inside the pattern of the sealing material, preferably, overlapped with the pattern of the sealing material so that the sealing material covers an end portion of the insulating film. A region surrounded by the sealing material 628 is filled with a filler 627. Alternatively, the region surrounded by the sealing material 628 is filled with a dry inert gas.

Finally, an FPC 632 is attached to a terminal electrode by a known method through an anisotropic conductive film 631. A cross-sectional view at this point is shown in FIG. 5. As for the terminal electrode, a transparent conductive film that is obtained in the same step as the first electrode 623 is preferably used as a top layer and is formed over a terminal electrode that is formed at the same time as a gate wiring.

Figure 5:
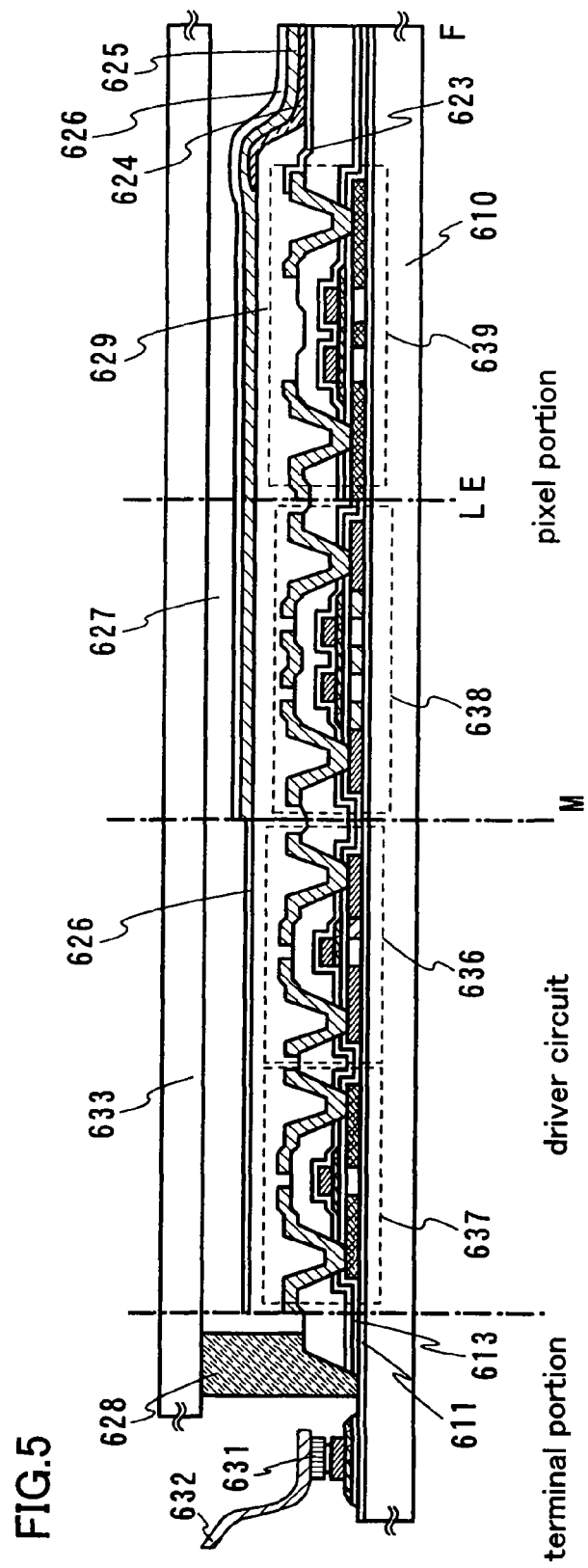
FIG. 5 is a cross-sectional view of a light-emitting device (Embodiment Mode 5)
Figure 6:
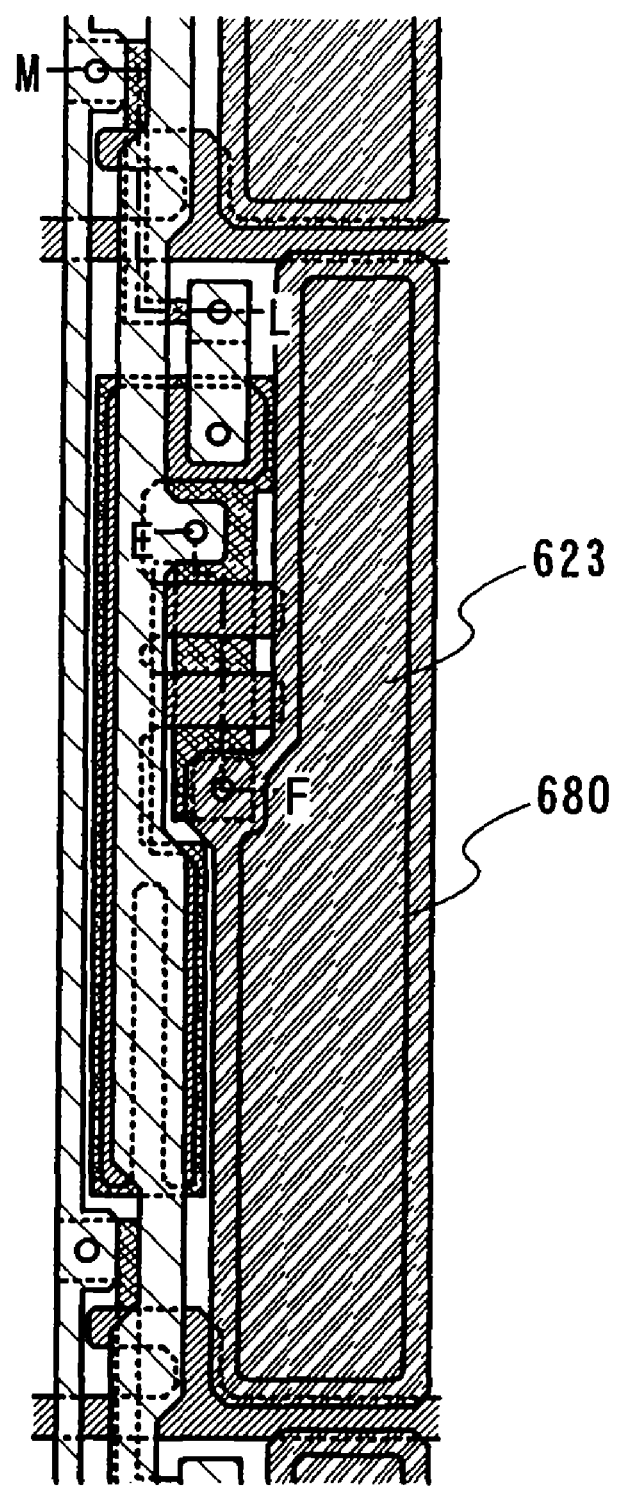
FIG. 6 is a top view of a pixel portion (Embodiment Mode 5)

FIG. 6 shows a top view of the pixel portion, and a cross-section taken along a chain line E-F in FIG. 6 corresponds to a cross-sectional structure of the p-channel TFT 639 in the pixel portion of FIG. 5. In addition, a cross-section taken along a chain line M-L in FIG. 6 corresponds to a cross-sectional structure of the n-channel TFT 638 in the pixel portion of FIG. 5. It is to be noted that a solid line indicated by reference numeral 680 of FIG. 6 represents the edge of the insulator 629. However, in FIG. 6, only the second conductive layer is shown and the first conductive layer is not shown.

Through the above steps, the pixel region, the driver circuit and the terminal portion can be formed over the same substrate.

In this embodiment mode, a TFT in the pixel portion is a double gate structure to reduce off current, and the TFT of Embodiment Mode 1 is used as an n-channel TFT in the driver circuit.

In addition, in a light-emitting device, a light emitting display surface may be provided on one side or both sides. When the first electrode 623 and the second electrode 625 are both formed by using a transparent conductive film, light of a light-emitting element is extracted through the substrate 610 and the sealing substrate 633 to both sides. In this case, the sealing substrate 633 or the filler 627 is preferably formed by using a transparent material.

When the second electrode 625 is formed by a metal film and the first electrode 623 is formed by a transparent conductive film, a structure in which light of a light-emitting element is extracted through only the substrate 610 to one side, that is, a bottom emission structure can be obtained. In this case, the sealing substrate 633 and the filler 627 are not required to be formed by using a transparent material.

Further, when the first electrode 623 is formed by a metal film and the second electrode 625 is formed by a transparent conductive film, a structure in which light of a light-emitting element is extracted through only the sealing substrate 633 to one side, that is, a top emission structure can be obtained. In this case, the substrate 610 is not required to be formed by using a transparent material.

Materials for the first electrode 623 and the second electrode 625 are required to be selected considering a work function. Each of the first electrode 623 and the second electrode 625 can be an anode or a cathode depending on a pixel structure. When polarity of a driving TFT is a p-channel type, the first electrode may be an anode and the second electrode may be a cathode. Alternatively, when polarity of the driving TFT is an n-channel type, the first electrode is preferably a cathode and the second electrode is an anode.

FIG. 7 shows an equivalent circuit diagram in the pixel portion of this embodiment mode in a case where full color display is performed. A TFT 638 in FIG. 7 corresponds to the switching TFT 638 in FIG. 5, and a TFT 639 corresponds to the current control TFT 639. As for a pixel displaying a red color, an OLED 703R emitting red light is connected to a drain region of the current control TFT 639, and a source region is connected to an anode side power supply line (R) 706R. In addition, an OLED 703R is connected to a cathode side power supply line 700. Further, as for the pixel displaying a green color, an OLED 703G emitting green light is connected to a drain region of the current control TFT, and a source region is connected to an anode side power supply line (G) 706G. In addition, as for the pixel displaying a blue color, an OLED 703B emitting blue light is connected to a drain region of the current control TFT, and a source region is connected to an anode side power supply line (B) 706B. Different voltage is applied to pixels emitting different colors in accordance with EL materials, respectively.

In the light-emitting device, a driving method for image display is not particularly limited, and for example, a dot sequential driving method, a line sequential driving method, an area sequential driving method and the like may be used. Typically, the line sequential driving method may be used, and a time division gray scale driving method and an area gray scale driving method may also be appropriately used. Further, a video signal inputted to the source line of the light emitting device may be an analog signal or a digital signal. The driver circuit and the like may be appropriately designed in accordance with the video signal.

Further, in a light-emitting device using a digital video signal, a video signal that is inputted into a pixel has constant voltage (CV) or has constant current (CC). As for a video signal with constant voltage (CV), voltage of a signal that is applied to a light-emitting element is constant (CVCV), or current of a signal that is applied to a light-emitting element is constant (CVCC). In addition, as for a video signal with constant current (CC), voltage of a signal that is applied to a light-emitting element is constant (CCCV), or current of a signal that is applied to a light-emitting element is constant (CCCC).

Further, in the light-emitting device, a protective circuit (such as a protective diode) for preventing electrostatic breakdown may also be provided.

Here, as a display device, an example of an active matrix light-emitting device is shown; however, the present invention can also be applied to an active matrix liquid crystal display device.

Further, this embodiment mode can be freely combined with Embodiment Mode 1, 2, 3, or 4.

EMBODIMENT MODE 6

This embodiment mode shows an example in which a method for forming a crystalline semiconductor film is partially different from the one in Embodiment Mode 5. In addition, an example of manufacturing a multi gate TFT will be explained with reference to FIGS. 8A to 8E.

First, similarly to Embodiment Mode 5, over a substrate having an insulating surface, a base insulating film and a semiconductor film having an amorphous structure are formed.

Then, similarly to Embodiment Mode 5, a nickel acetate solution containing a metal element having catalysis for promoting crystallization (nickel here) of 1 to 100 ppm in weight is coated using a spinner over the surface of the semiconductor film having an amorphous structure, and a nickel-containing layer is formed.

Next, similarly to Embodiment Mode 5, heat treatment is performed for crystallization. Here, after performing heat treatment for dehydrogenation (450° C. for 1 hour), heat treatment for crystallization (550 to 650° C. for 4 to 24 hours) is performed to obtain a crystalline semiconductor film.

Subsequently, similarly to Embodiment Mode 5, in order to increase the degree of crystallization and compensate defects remaining in the crystal grains, the crystalline semiconductor film is irradiated with laser light.

Then, the crystalline semiconductor film is patterned by using a photomask. Here, an island-shaped semiconductor layer 801 is formed, and several openings 803 are formed in the island-shaped semiconductor layer 801.

Then, first heat treatment for reducing distortions of the crystalline semiconductor film (treatment to heat the semiconductor film at about 400 to 1000° C. momentarily) is performed in a nitrogen atmosphere to obtain a flat semiconductor film. It is to be noted that the first heat treatment may also be performed to the crystalline semiconductor film before a patterning step.

After flushing treatment using a flush substance to remove an impurity such as F, a semiconductor film 802 containing a rare gas element is formed over the crystalline semiconductor film. Here, a PCVD apparatus including 20 chambers is used, and a monosilane gas is used as a flush substance and introduced continuously into a chamber at a gas flow rate of 8 to 10 SLM for 5 to 20 minutes to perform flushing treatment to the substrate surface, and then, a semiconductor film containing a rare gas element is formed continuously. It is to be noted that, in a case of a gas flow rate of 10 SLM, a flow rate for each chamber is 0.5 SLM, that is, $1.2 \times 10^{-7} m^3/h$.

Subsequently, second heat treatment for gettering (heat treatment for heating the semiconductor film at about 400 to 1000° C. momentarily) is performed in a nitrogen atmosphere. By this second heat treatment, the metal element moves to the semiconductor film containing a rare gas element, and the metal element contained in the crystalline semiconductor film covered with a barrier layer is removed, or the concentration of the metal element is reduced.

Figure 8A:
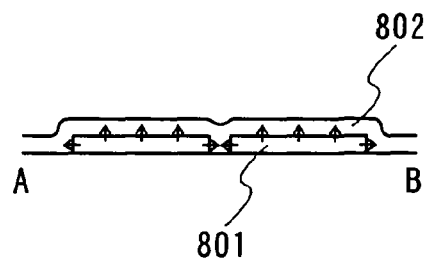
FIGS. 8A, 8C and 8D are cross-sectional views
Figure 8B:
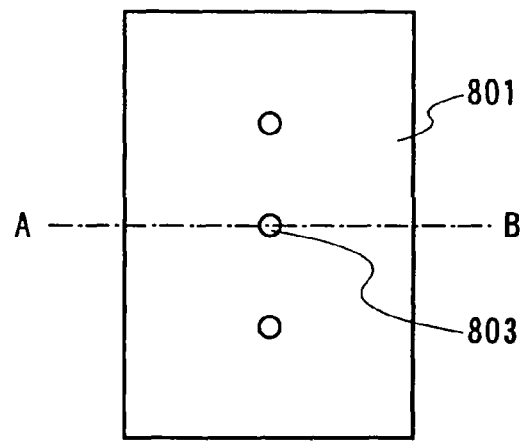
FIGS. 8B and 8E are top views each showing a multi gate TFT (Embodiment Mode 6)

In addition, the crystalline semiconductor film is patterned before gettering, and the end surface of the island-shaped semiconductor layer 801 formed of the crystalline semiconductor film is covered with the semiconductor film 802 containing a rare gas element. Therefore, as shown in FIG. 8A, the metal element contained in the crystalline semiconductor film moves toward the semiconductor film 802 containing a rare gas element, in other words, the metal element not only moves in a perpendicular direction to the substrate surface but also in a parallel direction to the substrate surface in the periphery of the end surface. Arrows in FIG. 8A schematically show directions of the move of the metal element by the second heat treatment. Further, FIG. 8B is a top view, and a cross-section taken along a chain line A-B corresponds to FIG. 8A.

Further, since the island-shaped semiconductor layer 801 formed of the crystalline semiconductor film has the openings 803 inside the pattern, the metal element moves in a parallel direction to the substrate surface also in the vicinity of the openings 803. In FIG. 8B, an example in which the pattern of the crystalline semiconductor film has three openings is shown; however, the number of the openings is not particularly limited, and two openings, one opening, or four or more openings may be provided.

By providing the openings 803 inside the pattern of the island-shaped semiconductor layer 801 formed of the crystalline semiconductor film, the metal element in the island-shaped semiconductor layer 801 can be effectively removed.

Then, only the semiconductor film containing a rare gas element is selectively removed.

Next, an oxide film over the surface of the semiconductor layer is removed by an etchant containing hydrofluoric acid, and at the same time, the surface of the semiconductor layer is cleaned.

Then, an insulating film 806 covering the semiconductor layer is formed. The insulating film 806 functions as a gate insulating film of a TFT that will be formed later.

Subsequently, over the insulating film 806, a first conductive film having a thickness of 20 to 100 nm and a second conductive film having a thickness of 100 to 400 nm are stacked. In this embodiment mode, a tantalum nitride film having a thickness of 50 nm and a tungsten film having a thickness of 370 nm are sequentially stacked over the insulating film, and each gate electrode and each wiring are formed by performing patterning as shown in Embodiment Mode 1. In this embodiment mode, a photomask or a reticle provided with an assist pattern that is formed of a diffraction grating pattern or a semi-transmitting film and has a function of reducing light intensity is used to form each gate electrode and each wiring.

Figure 8C:
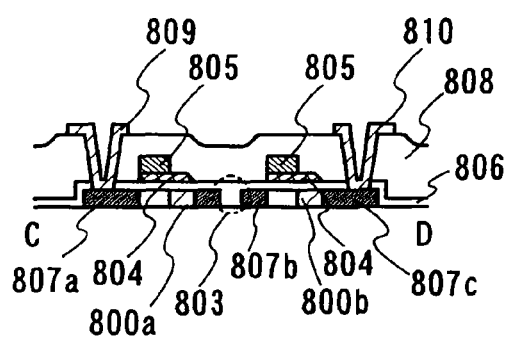
Figure 8E:
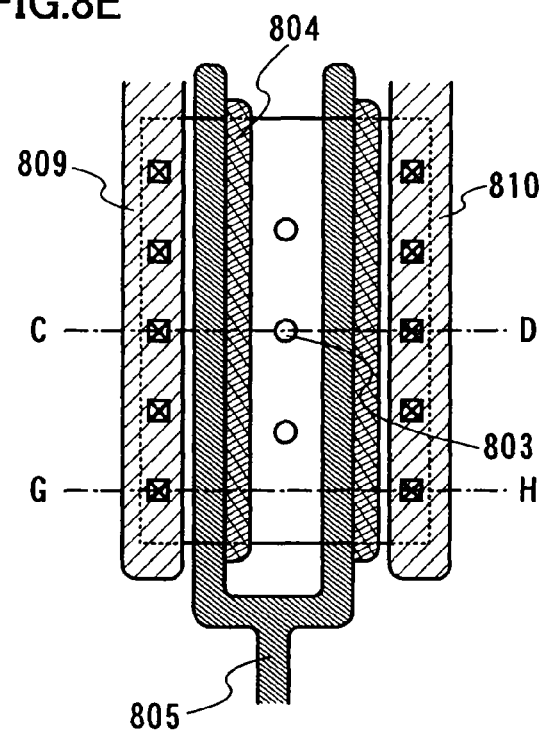
Figure 8D:
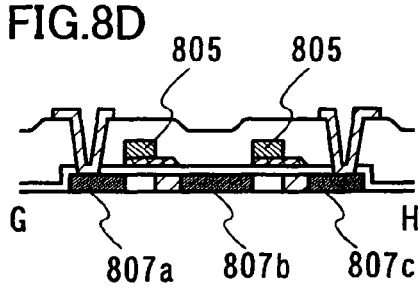

In subsequent steps, an impurity element is added to the semiconductor layer, the added impurity element is activated, an interlayer insulating film 808 is formed, and a source wiring and a drain wiring 809 and 810 are formed to manufacture a multi gate TFT as shown in FIGS. 8C, 8D, and 8E in accordance with Embodiment Mode 1 or 5. Here, a TFT having two channel formation regions is shown; however, a TFT having three or more channel formation regions can also be employed.

It is to be noted that FIG. 8E is a top view, and a cross-section taken along a chain line C-D corresponds to FIG. 8C and a cross-section taken along a chain line G-H corresponds to FIG. 8D.

A TFT shown in FIG. 8C is a TFT including two channel formation regions between a high-concentration impurity region 807a on a source side and a high-concentration impurity region 807c on a drain side, and one low-concentration impurity region 800a is provided between the two channel formation regions. In addition, another low-concentration impurity region 800b is provided between the channel formation region on the drain side and the high-concentration impurity region 807c. The low-concentration impurity regions 800a and 800b are separated. Further, the low-concentration impurity regions 800a and 800b are overlapped with first conductive layers 804. In addition, two of the channel formation regions are overlapped with second conductive layers 805.

Since an opening 803 is formed in the high-concentration impurity region 807b between two of the channel formation regions, the high-concentration impurity region 807b is shown as being divided in FIG. 8C. When an opening is not provided in the high-concentration impurity region 807b, the high-concentration impurity region 807b is connected as shown in FIG. 8D. The multi gate TFT has no problems in driving operation also with an opening 803.

In this embodiment mode, the low-concentration impurity regions 800a and 800b can be provided only on a drain side, and thus, reliability of a whole circuit having the TFT shown in this embodiment mode can be improved. In addition, by the TFT in this embodiment mode, the area of the whole circuit can be reduced compared with a case where low-concentration impurity regions are formed on both of a source side and a drain side. Further, parasitic capacitance can be lower in the TFT in this embodiment mode compared with a case where low-concentration impurity regions overlapped with a gate electrode are formed on both of a source side and a drain side.

In addition, parasitic resistance of the TFT shown in this embodiment mode can be lower compared with a case where low-concentration impurity regions are formed on both of a source side and a drain side. In a case of a TFT where low-concentration impurity regions are formed on both of a source side and a drain side, resistance on a source side is added and parasitic resistance is increased.

Further, this embodiment mode can be freely combined with Embodiment Mode 1, 2, 3, 4, or 5.

EMBODIMENT MODE 7

Figure 9A:
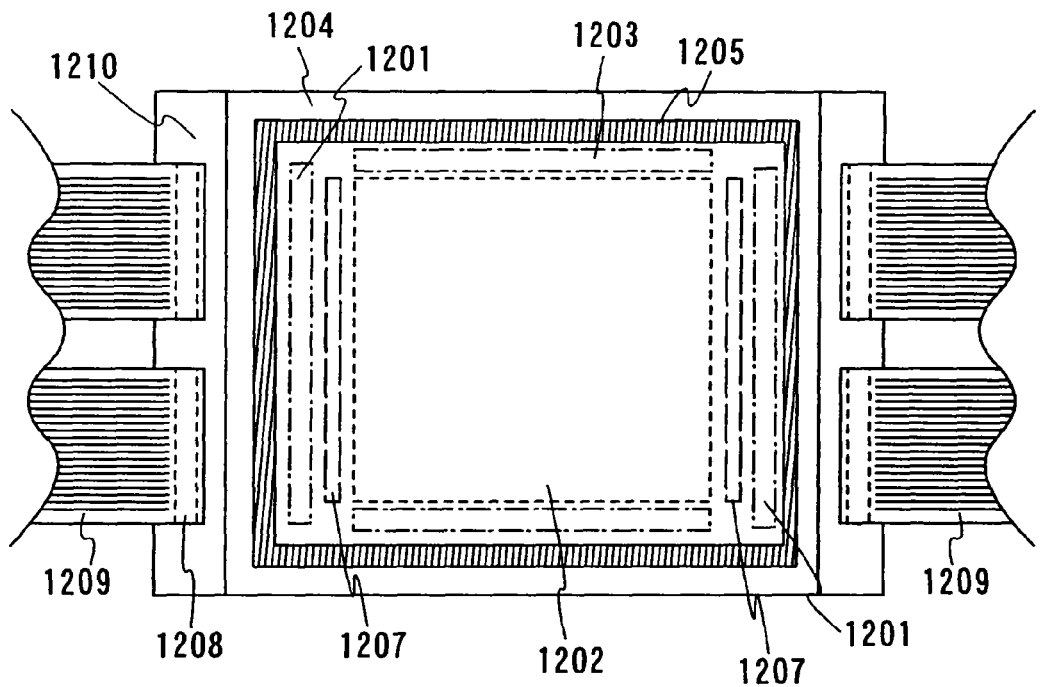
FIGS. 9A and 9B are views each showing an example of a module.
Figure 9B:
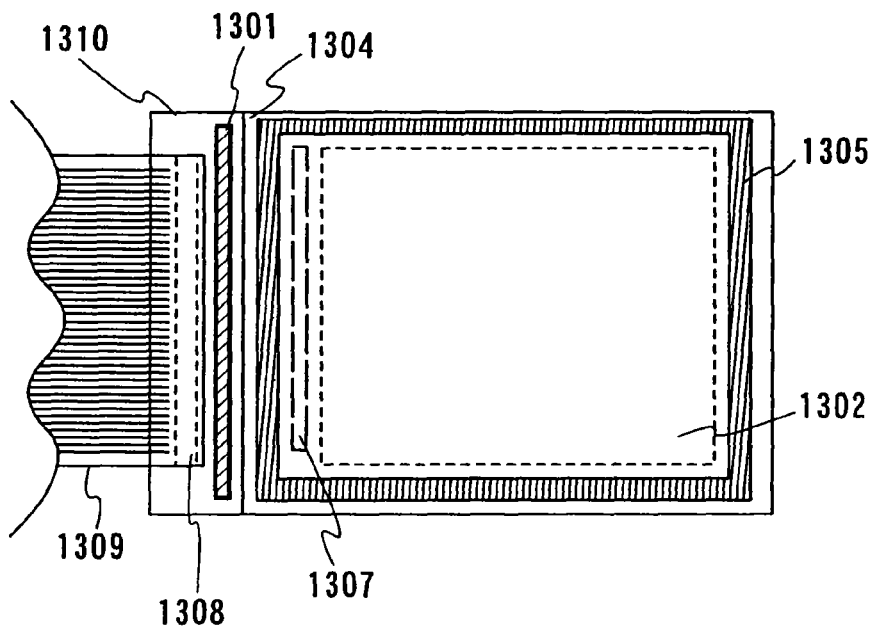

This embodiment mode will explain an example in which an FPC or a driving IC is mounted on a light-emitting display panel with reference to FIGS. 9A and 9B.

Here, FIG. 9A shows an example of a top view of a light-emitting device in which FPCs 1209 are attached to terminal portions 1208 in four places. Over a substrate 1210, a pixel portion 1202 including a light-emitting element and a TFT, a gate driver circuit 1203 including a TFT, and a source driver circuit 1201 including a TFT are formed. An active layer of a TFT is formed of a semiconductor film having a crystal structure, and these circuits are formed over the same substrate. Therefore, an EL display panel that realizes system-on-panel can be manufactured.

It is to be noted that the substrate 1210 is covered with a protective film except for a contact portion, and a base layer containing a substance having a photocatalyst function is provided over the protective film.

In addition, connection regions 1207 provided in two places so as to interpose a pixel portion are provided so that a second electrode of a light-emitting element is in contact with a wiring of a lower layer. Further, a first electrode of a light-emitting element is electrically connected to a TFT provided in the pixel portion.

A sealing substrate 1204 is fixed to the substrate 1210 with a sealing material 1205 surrounding the pixel portion and the driver circuit, and a filler material surrounded by the sealing material. A structure filled with a filler material containing a transparent drying agent may also be employed. Further, a drying agent may also be provided in a region which is not overlapped with a pixel portion.

Further, FIG. 9A shows an example suitable for a light-emitting device having a relatively large size of a XGA class (for example, a diagonal line is 4.3 inches) whereas FIG. 9B shows an example employing a COG method suitable for a compact size with a narrower frame (for example, a diagonal line is 1.5 inches).

In FIG. 9B, a driver IC 1301 is mounted over a substrate 1310, and an FPC 1309 is mounted over a terminal portion 1308 provided beyond the driver IC. From an aspect of increasing productivity, a plurality of driver ICs 1301 is mounted over a rectangle substrate that is 300 to 1000 mm or more on one side. In other words, a plurality of circuit patterns, each of which has a driver circuit portion and an input/output terminal as one unit, is formed over the substrate and separated so that the driver ICs can be finally obtained separately. As for the length of a longer side of the driver IC, the driver IC may be formed to have a rectangular shape having a longer side of 15 to 80 mm and a shorter side of 1 to 6 mm in consideration of a length of one side of a pixel portion or a pixel pitch, or may be formed so that the length of a longer side is a length corresponding to one side of a pixel region or a length in which one side of a driver circuit is added to one side of the pixel portion.

For the outside dimension, the driver IC has an advantage over an IC chip in the length of the longer side. When a driver IC formed to be 15 to 80 mm on a longer side is used, the number of driver ICs to be required for mounting corresponding to the pixel portion is smaller as compared with the case of using IC chips, thereby improving the yield in manufacturing. When a driver IC is formed over a glass substrate, the productivity is not damaged because a driver IC is not limited by the shape of a host substrate. This is a great advantage as compared with a case of taking out IC chips from a circular silicon wafer.

In addition, a TAB method may also be employed, and in that case, a plurality of tapes is attached and driver ICs may be mounted on the tapes. As in the case of the COG method, a single driver IC may be mounted on a single tape. In this case, a metal piece or the like for fixing a driver IC may be attached together for enhancing the strength.

A connection region 1307 provided between the pixel portion 1302 and the driver IC 1301 is provided so that a second electrode of a light-emitting element is in contact with a wiring of a lower layer. Further, a first electrode of a light-emitting element is electrically connected to a TFT provided in a pixel portion.

In addition, a sealing substrate 1304 is fixed to the substrate 1310 with a sealing material 1305 surrounding the pixel portion 1302, and a filler material surrounded by the sealing material.

When an amorphous semiconductor film is used as an active layer of a TFT in the pixel portion, it is difficult to form a driver circuit over the same substrate, and thus, the structure of FIG. 9B is employed also for a large size.

An active matrix light-emitting device is shown as an example of a display device here, but the present invention can also be applied to an active matrix liquid crystal display device as a matter of course. In the active matrix liquid crystal display device, pixel electrodes arranged in matrix are driven to form a display pattern on the screen. Specifically, voltage is applied to a selected pixel electrode and an opposite electrode corresponding to the pixel electrode, and thus, a liquid crystal layer between the pixel electrode provided over the element substrate and the opposite electrode provided over the opposite substrate is optically modulated. The optical modulation can be recognized as a display pattern by an observer. The opposite substrate and the element substrate are arranged at an even interval and the space therebetween is filled with a liquid crystal material. As for the liquid crystal material, a method may be employed, in which the liquid crystal material is dropped under reduced pressure so that a bubble does not enter using the sealing material as a closed pattern and the substrates are attached to each other. Alternatively, a dip method (pumping method) may be employed, in which the liquid crystal is injected using capillary phenomenon after providing a seal pattern having an opening portion and attaching the TFT substrates.

The present invention can also be applied to a liquid crystal display device using a field sequential driving method in which light is shuttered without using a color filter and backlight light sources for three colors of R, G, and B are flashed on and off at high speed.

As described above, by using a manufacturing method or a structure shown in any of Embodiment Modes 1 to 6, which implements the present invention, various electronic devices can be manufactured.

EMBODIMENT MODE 8

As a semiconductor device and an electronic device according to the present invention, a video camera, a digital camera, a goggle type display (a head mount display), a navigation system, an audio reproducing device (such as a car stereo or an audio component), a notebook personal computer, a game machine, a mobile information terminal (such as a mobile computer, a mobile phone, a mobile game machine, or an electronic book), an image reproducing device equipped with a recording medium (specifically, a device for reproducing a recording medium such as Digital Versatile Disc (DVD) and including a display for displaying the image), and the like are given. FIGS. 10A to 10E, and 11 show specific examples of the electronic devices.

Figure 10A:
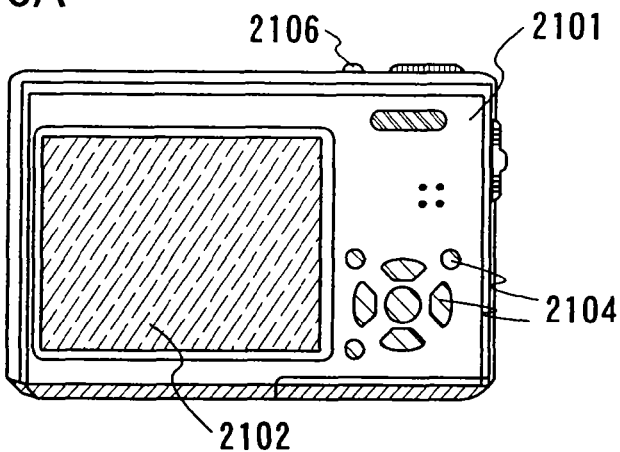
FIGS. 10A to 10E are views each showing an example of an electronic device.

FIG. 10A shows a digital camera, which includes a main body 2101, a display portion 2102, an imaging portion, operation keys 2104, a shutter 2106, and the like. It is to be noted that FIG. 10A is a view from a side of the display portion 2102 and the imaging portion is not shown. By the present invention, a highly reliable digital camera having a high-definition display portion can be achieved.

Figure 10B:
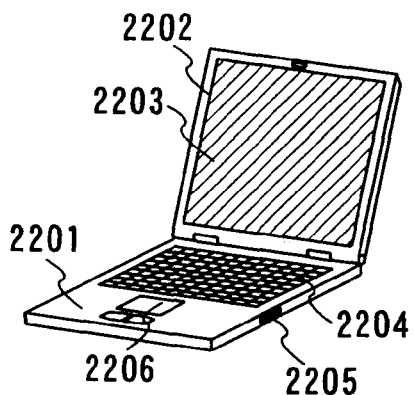

FIG. 10B shows a notebook personal computer, which includes a main body 2201, a chassis 2202, a display portion 2203, a keyboard 2204, an external connection port 2205, a pointing mouse 2206, and the like. By the present invention, a highly reliable notebook personal computer having a high-definition display portion can be achieved.

Figure 10C:
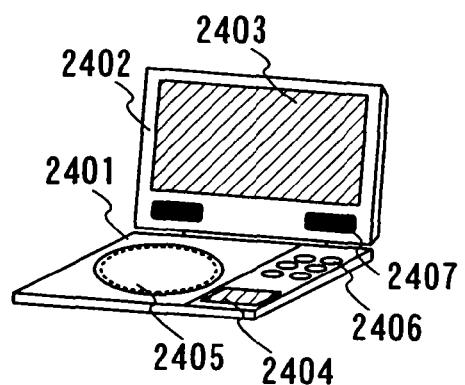

FIG. 10C shows a mobile image reproducing device equipped with a recording medium (specifically a DVD reproducing device), which includes a main body 2401, a chassis 2402, a display portion A 2403, a display portion B 2404, a recording medium (such as a DVD) reading portion 2405, operation keys 2406, a speaker portion 2407 and the like. The display portion A 2403 mainly displays image information and the display portion B 2404 mainly displays character information. It is to be noted that the image reproducing device equipped with a recording medium also includes a home game machine. By the present invention, a highly reliable image reproducing device having a high-definition display portion can be achieved.

Figure 10D:
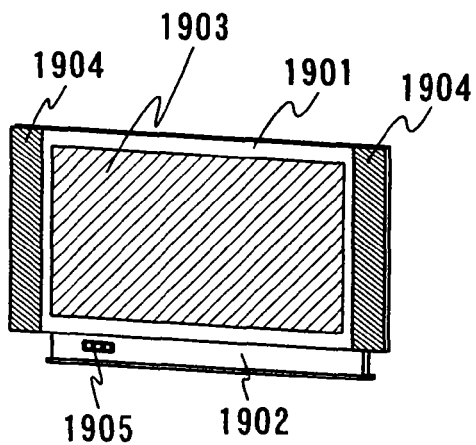

FIG. 10D shows a display device, which includes a chassis 1901, a support 1902, a display portion 1903, speakers 1904, a video input terminal 1905, and the like. The display device is manufactured by using a thin film transistor formed by the manufacturing method described in the above embodiment modes for the display portion 1903 and a driver circuit. It is to be noted that, as the display device, a liquid crystal display device, a light-emitting device or the like can be given, including all kinds of display devices for displaying information, such as devices for a personal computer, for receiving TV broad casting, for displaying an advertisement and the like. By the present invention, a highly reliable display device having a high-definition display portion, particularly a large-sized display device having a large screen of 22 to 50 inches can be achieved.

A thin film integrated circuit having a TFT of the present invention can also be used as a non-contact thin film integrated circuit device (also referred to as a wireless IC tag or an RFID (Radio Frequency Identification)) by additionally forming an antenna or the like. By attaching an IC tag to various electronic devices, a distribution channel of the electronic devices can be clarified.

Figure 10E:
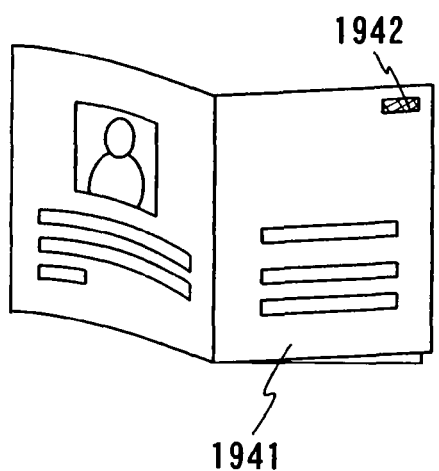

FIG. 10E shows a passport 1941 to which a wireless IC tag 1942 is attached. The wireless IC tag 1942 may be embedded in the passport 1941. Similarly, the wireless IC tag may be attached to or embedded in a driver's license, a credit card, a banknote, a coin, a certificate, a merchandise coupon, a ticket, a traveler's check (T/C), a health insurance card, a residence certificate, a family register, and the like. In this case, only information showing that this product is a real one is inputted into the wireless IC tag, and access authority is set so that information is not read out or written in illegally, which can be achieved by using the memory shown in the other embodiment modes as described above. By using as the tag as described above, real products can be distinguished from forged ones. In addition, the wireless IC tag can also be used as a memory. Further, by providing the wireless IC tag in containers for wrapping objects, recording media, personal belongings, foods, clothes, livingware, electronic devices, and the like, a system such as an inspection system can be more effectively carried out.

Figure 11:
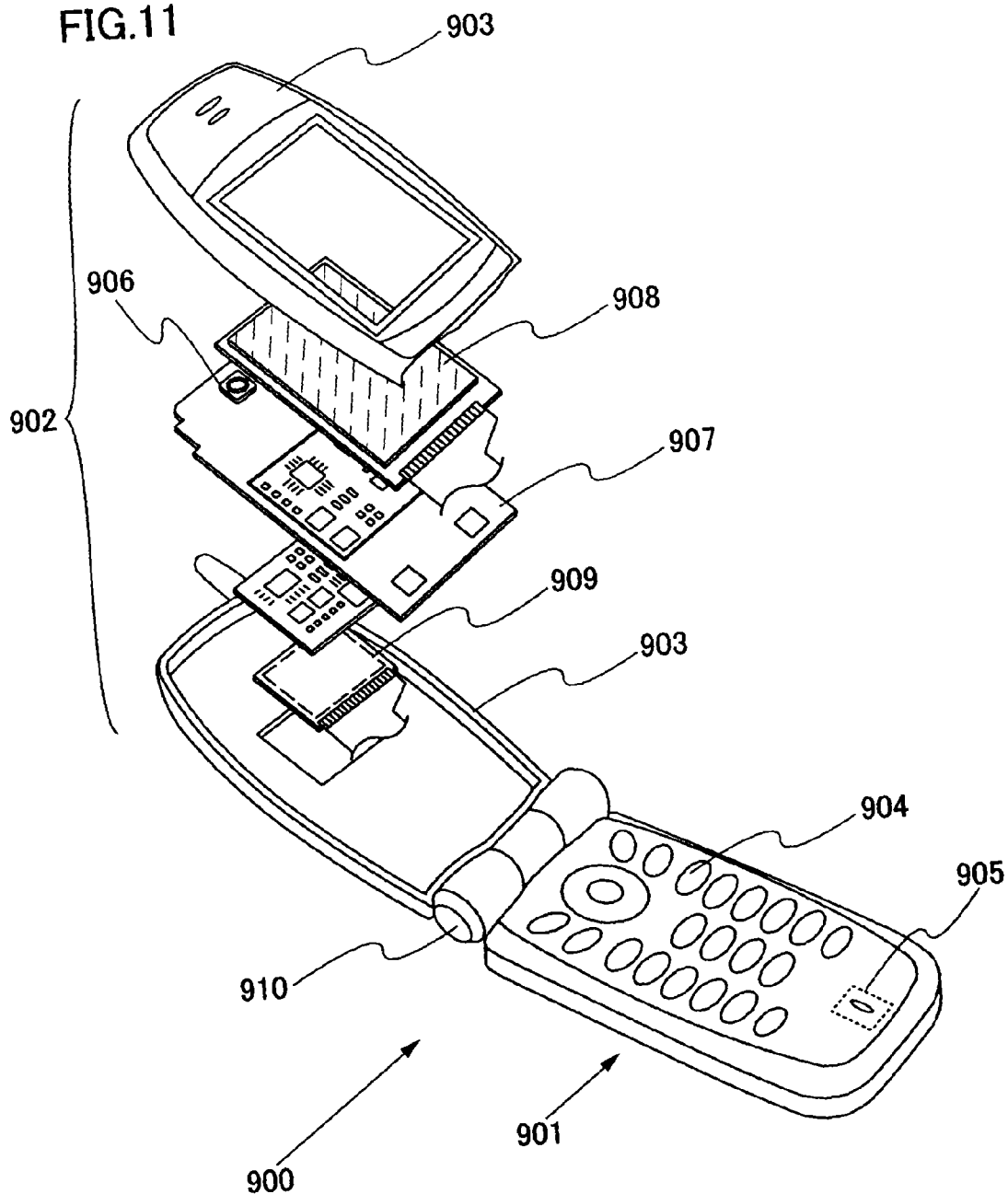
FIG. 11 is a view showing an example of an electronic device.

A mobile phone shown in FIG. 11 includes a main body (A) 901 provided with operation switches 904, a microphone 905 and the like, and a main body (B) 902 provided with a display panel (A) 908, a display panel (B) 909, a speaker 906 and the like, which are connected with a hinge 910 so that the mobile phone can be opened or folded. The display panel (A) 908 and the display panel (B) 909 are incorporated into a chassis 903 of the main body (B) 902 together with a circuit substrate 907. Pixel portions of the display panel (A) 908 and the display panel (B) 909 are arranged so as to be seen from an open window formed in the chassis 903.

The specifications of the display panel (A) 908 and the display panel (B) 909 such as the number of pixels can be appropriately set in accordance with the function of a mobile phone 900. For example, the display panel (A) 908 and the display panel (B) 909 can be used in combination so as to be used as a main display screen and a sub-display screen, respectively.

By the present invention, a highly reliable mobile information terminal having a high-definition display portion can be achieved.

The mobile phone of this embodiment mode can be changed into various modes in accordance with the function or applications. For example, by incorporating an imaging device into the hinge 910, a mobile phone equipped with a camera can be provided. In addition, also when the operation switches 904, the display panel (A) 908 and the display panel (B) 909 are incorporated into one chassis, the aforementioned effect can be obtained. Further, when the structure of this embodiment mode is applied to an information display terminal having a plurality of display portions, a similar effect can be obtained.

As described above, various electronic devices implementing the present invention, that is, using a manufacturing method or a structure shown in any of Embodiment Modes 1 to 7 can be manufactured.

In a TFT having a structure of the present invention, in which an LDD region overlapped with a gate electrode is provided only on a drain side, electric field intensity in the vicinity of the drain can be relieved, and thus, deterioration of a circuit can be prevented. In addition, power consumption of a circuit can be reduced because parasitic capacitance can be reduced.

This application is based on Japanese Patent Application serial No. 2005-171565 field in Japan Patent Office on Jun. 10, 2005, the entire contents of which are hereby incorporated by reference.

What is claimed is:

1. A method for manufacturing a semiconductor device, the method comprising the steps of:
   forming a semiconductor layer over a substrate having an insulating surface,
   forming an insulating film over the semiconductor layer,
   forming a first conductive film over the insulating film,
   forming a second conductive film over the first conductive film, forming a resist pattern over the second conductive film, the resist pattern having a first portion and a second portion with a thickness thinner than that of the first portion, forming a gate electrode by selectively etching the first conductive film and the second conductive film, the gate electrode having a first portion and a second portion with a thickness thinner than that of the first portion, wherein the first portion of the gate electrode includes the first conductive film and the second conductive film, and wherein the second portion of the gate electrode includes the first conductive film, forming first impurity regions in the semiconductor layer on both sides of a channel formation region by injecting an impurity element into the semiconductor layer using the first portion and the second portion of the gate electrode as a mask, and forming a second impurity region in the semiconductor layer in a region overlapped with the second portion of the gate electrode by injecting an impurity element into the semiconductor layer through the second portion of the gate electrode.

2. The method for manufacturing a semiconductor device according to claim 1, wherein the channel formation region overlaps with the first portion of the gate electrode, and wherein the channel formation region is disposed between one of the first impurity regions and the second impurity region.

3. The method for manufacturing a semiconductor device according to claim 1, wherein a conductive material of the first conductive film is different from a conductive material of the second conductive film.

4. The method for manufacturing a semiconductor device according to claim 1, wherein a cross-sectional shape of the resist pattern is asymmetrical in a width or a length direction of the gate electrode.

5. The method for manufacturing a semiconductor device according to claim 1, wherein the first impurity regions do not overlap with the gate electrode.

6. The method for manufacturing a semiconductor device according to claim 1, wherein a concentration of the impurity element of each of the first impurity regions is higher than a concentration of the impurity element of the second impurity region.

7. The method for manufacturing a semiconductor device according to claim 1, wherein the resist pattern is formed by using one of a photomask and a reticle, and wherein each of the photomask and the reticle has a diffraction grating pattern or a semi-transmitting portion.

8. A method for manufacturing a semiconductor device, the method comprising the steps of:

forming a semiconductor layer over a substrate having an insulating surface, forming an insulating film over the semiconductor layer, forming a first conductive film over the insulating film, forming a second conductive film over the first conductive film, forming a resist pattern over the second conductive film, the resist pattern having a first portion and a second portion with a thickness thinner than that of the first portion, forming a gate electrode by selectively etching the first conductive film and the second conductive film, the gate electrode having a first portion and a second portion with a thickness thinner than that of the first portion, wherein the first portion of the gate electrode includes the first conductive film and the second conductive film, and wherein the second portion of the gate electrode includes the first conductive film, forming first impurity regions in the semiconductor layer on both sides of a channel formation region by injecting an impurity element into the semiconductor layer, and forming a second impurity region in the semiconductor layer in a region overlapped with the second portion of the gate electrode by injecting an impurity element into the semiconductor layer.

9. The method for manufacturing a semiconductor device according to claim 8, wherein the channel formation region overlaps with the first portion of the gate electrode, and wherein the channel formation region is disposed between one of the first impurity regions and the second impurity region.

10. The method for manufacturing a semiconductor device according to claim 8, wherein a conductive material of the first conductive film is different from a conductive material of the second conductive film.

11. The method for manufacturing a semiconductor device according to claim 8, wherein a cross-sectional shape of the resist pattern is asymmetrical in a width or a length direction of the gate electrode.

12. The method for manufacturing a semiconductor device according to claim 8, wherein the first impurity regions do not overlap with the gate electrode.

13. The method for manufacturing a semiconductor device according to claim 8, wherein a concentration of the impurity element of each of the first impurity regions is higher than a concentration of the impurity element of the second impurity region.

14. The method for manufacturing a semiconductor device according to claim 8, wherein the resist pattern is formed by using one of a photomask and a reticle, and wherein each of the photomask and the reticle has a diffraction grating pattern or a semi-transmitting portion.

15. A method for manufacturing a semiconductor device, the method comprising the steps of:

forming a semiconductor layer over a substrate having an insulating surface, forming an insulating film over the semiconductor layer, forming a first conductive film over the insulating film, forming a second conductive film over the first conductive film, forming a resist pattern over the second conductive film, the resist pattern having a first portion and a second portion with a thickness thinner than that of the first portion, forming a gate electrode by selectively etching the first conductive film and the second conductive film, the gate electrode having a first portion and a second portion with a thickness thinner than that of the first portion, wherein the first portion of the gate electrode includes the first conductive film and the second conductive film, and wherein the second portion of the gate electrode includes the first conductive film, forming first impurity regions in the semiconductor layer by injecting an impurity element into the semiconductor layer using the first portion and the second portion of the gate electrode as a mask, and forming a second impurity region in the semiconductor layer by injecting an impurity element into the semiconductor layer through the second portion of the gate electrode.

16. The method for manufacturing a semiconductor device according to claim 15, wherein a channel formation region overlaps the first portion of the gate electrode, and wherein the channel formation region is disposed between one of the first impurity regions and the second impurity region.

17. The method for manufacturing a semiconductor device according to claim 15, wherein a conductive material of the first conductive film is different from a conductive material of the second conductive film.

18. The method for manufacturing a semiconductor device according to claim 15, wherein a cross-sectional shape of the resist pattern is asymmetrical in a width or a length direction of the gate electrode.

19. The method for manufacturing a semiconductor device according to claim 15, wherein the first impurity regions do not overlap with the gate electrode.

20. The method for manufacturing a semiconductor device according to claim 15, wherein a concentration of the impurity element of each of the first impurity regions is higher than a concentration of the impurity element of the second impurity region.

21. The method for manufacturing a semiconductor device according to claim 15, wherein the resist pattern is formed by using one of a photomask and a reticle, and wherein each of the photomask and the reticle has a diffraction grating pattern or a semi-transmitting portion.

* * * * *